US012733555B2

(12) United States Patent
Chung et al.

(10) Patent No.: US 12,733,555 B2
(45) Date of Patent: Sep. 8, 2026

(54) SEMICONDUCTOR PACKAGE

(71) Applicant: Samsung Electronics Co., Ltd., Suwon-si (KR)

(72) Inventors: Hyun Soo Chung, Suwon-si (KR); Young Lyong Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 375 days.

(21) Appl. No.: 18/483,211

(22) Filed: Oct. 9, 2023

(65) Prior Publication Data

US 2024/0136331 A1 Apr. 25, 2024
US 2024/0234376 A9 Jul. 11, 2024

(30) Foreign Application Priority Data

Oct. 25, 2022 (KR) ........................ 10-2022-0137954

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 70/685* (2026.01);
(Continued)

(58) Field of Classification Search
CPC ... H01L 21/486; H01L 21/561; H01L 23/147; H01L 23/49827; H01L 23/13; H01L 23/3675; H01L 23/562; H01L 23/3135; H01L 23/3171; H01L 23/3192; H01L 23/5384; H01L 25/18; H01L 25/50; H10W 90/288; H10W 90/701; H10W 90/401; H10W 72/20; H10W 42/121;
(Continued)

(56) References Cited

U.S. PATENT DOCUMENTS 6,551,862 B2 4/2003 Oota et al.
8,426,246 B2 4/2013 Toh et al.
(Continued)

FOREIGN PATENT DOCUMENTS

KR 101391108 B1 4/2014
KR 102344896 B1 12/2021

*Primary Examiner* — Steven B Gauthier
*Assistant Examiner* — Marc-Anthony Armand
(74) *Attorney, Agent, or Firm* — Harness, Dickey & Pierce, P.L.C.

(57) ABSTRACT

A semiconductor package may include a circuit board, an interposer structure on the circuit board, a mold layer, and a first semiconductor chip and a second semiconductor chip spaced apart from each other in a first direction on a center region of the interposer structure and electrically connected to the interposer structure. The interposer structure may include a plurality of trenches in an edge region of the interposer structure and extending through the interposer structure. The mold layer may be in the plurality of trenches and may wrap the first and second semiconductor chips. The mold layer may include a penetrating portion in the plurality of trenches and a stack portion on the interposer structure. A bottom surface of the penetrating portion of the mold layer may be on a same plane as a bottom surface of the interposer structure.

18 Claims, 27 Drawing Sheets

(51) Int. Cl.
*H10W 70/685* (2026.01)
*H10W 72/00* (2026.01)
*H10W 74/10* (2026.01)

(52) U.S. Cl.
CPC ........ *H10W 74/111* (2026.01); *H10W 72/823* (2026.01); *H10W 90/721* (2026.01); *H10W 90/722* (2026.01); *H10W 90/724* (2026.01)

(58) Field of Classification Search
CPC ............. H10W 70/611; H10W 70/635; H10W 70/095; H10W 70/698; H10W 70/65; H10W 40/22; H10W 74/117; H10W 74/121; H10W 74/137; H10W 74/147; H10W 74/141
See application file for complete search history.

(56) References Cited

U.S. PATENT DOCUMENTS 9,373,574 B2 6/2016 Jang et al.
10,714,401 B2 7/2020 Jang
2006/0103021 A1* 5/2006 Liu ..................... H10W 74/117 257/738
2015/0162301 A1* 6/2015 Huang .................... H10P 54/00 438/113
2017/0011993 A1* 1/2017 Zhao ..................... H10W 70/65
2022/0013487 A1* 1/2022 Kim .................... H01L 23/5385
2022/0037286 A1 2/2022 Park et al.
2022/0344279 A1* 10/2022 Kim .................... H01L 21/6835
2023/0290704 A1* 9/2023 Chen ....................... H01L 24/32

* cited by examiner

SEMICONDUCTOR PACKAGE

CROSS-REFERENCE TO RELATED APPLICATION

This application claims priority from Korean Patent Application No. 10-2022-0137954, filed on Oct. 25, 2022 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor package.

2. Description of the Related Art

An interposer market is growing due to a high specification of a set and adoption of a high bandwidth memory (HBM). For example, a semiconductor package using a silicon-based interposer may be manufactured by mounting a semiconductor chip on the silicon-based interposer and by molding the mounted semiconductor chip with a molding material.

On the other hand, when the mounted semiconductor chip is molded with the molding material, voids may occur between the interposer and the semiconductor chip and/or between the semiconductor chips spaced apart from each other.

SUMMARY

Aspects of the present disclosure provide a semiconductor package having improved reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an example embodiment, a semiconductor package may include a circuit board; an interposer structure on the circuit board, the interposer structure including an edge region and a center region defined by the edge region, the edge region including a plurality of trenches, the plurality of trenches extending through the interposer structure; a first semiconductor chip and a second semiconductor chip on the center region of the interposer structure, the first semiconductor chip and the second semiconductor chip being electrically connected to the interposer structure, and the first semiconductor chip and the second semiconductor chip being spaced apart from each other in a first direction; and a mold layer in the plurality of trenches. The mold layer may wrap the first semiconductor chip and the second semiconductor chip. The mold layer may include a penetrating portion in the plurality of trenches and a stack portion on the interposer structure. A bottom surface of the penetrating portion of the mold layer may be on a same plane as a bottom surface of the interposer structure.

According to an example embodiment, a semiconductor package may include a circuit board; an interposer structure on the circuit board; a first semiconductor chip on the interposer structure and electrically connected to the interposer structure; one or more second semiconductor chips on the interposer structure, the one or more second semiconductor chips being electrically connected to the interposer structure, and the one or more second semiconductor chips being spaced apart from the first semiconductor chip in a first direction; and a mold layer including a penetrating portion in the interposer structure and a stack portion on the interposer structure. One side wall of the penetrating portion of the mold layer may be in a same plane as a side wall of the interposer structure. A bottom surface of the penetrating portion of the mold layer may be coplanar with a bottom surface of the interposer structure.

According to an example embodiment, a semiconductor package may include a circuit board; an interposer structure on the circuit board, the interposer structure including an edge region and a center region defined by the edge region, the edge region including a plurality of trenches, the plurality of trenches having side walls that each include a planar first surface and a curved second surface; a logic chip on the center region of the interposer structure and electrically connected to the interposer structure; one or more memory chips on the interposer structure and spaced apart from the logic chip in a first direction; a mold layer in the plurality of trenches, the mold layer wrapping the logic chip and the one or more memory chips, the mold layer including a penetrating portion in the plurality of trenches and a stack portion on the interposer structure; a passivation film on a bottom surface of the interposer structure, the passivation film covering a bottom surface of the penetrating portion of the mold layer; a plurality of connection terminals between the passivation film and the circuit board; and an underfill between the interposer structure and the circuit board. The underfill may cover the plurality of connection terminals. The underfill may cover a part of side walls of the penetrating portion of the mold layer. The planar first surface may be opposite the logic chip. The curved second surface may face the logic chip. The planar first surface and the side walls of the interposer structure may be on a same plane. The bottom surface of the penetrating portion of the mold layer may be coplanar with the bottom surface of the interposer structure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

In the present specification, although terms such as first, second, top and bottom are used to describe various elements or components, it goes without saying that these elements or components are not limited by these terms. These terms are only used to distinguish a single element or component from other elements or components. Therefore, it goes without saying that a first element or component referred to below may be a second element or component within technical ideas of the present disclosure. In addition, it goes without saying that a lower element or component referred to below may be an upper element or component within technical ideas of the present disclosure.

Hereinafter, embodiments according to technical ideas of the present disclosure will be described with reference to the accompanying drawings.

Figure 1:
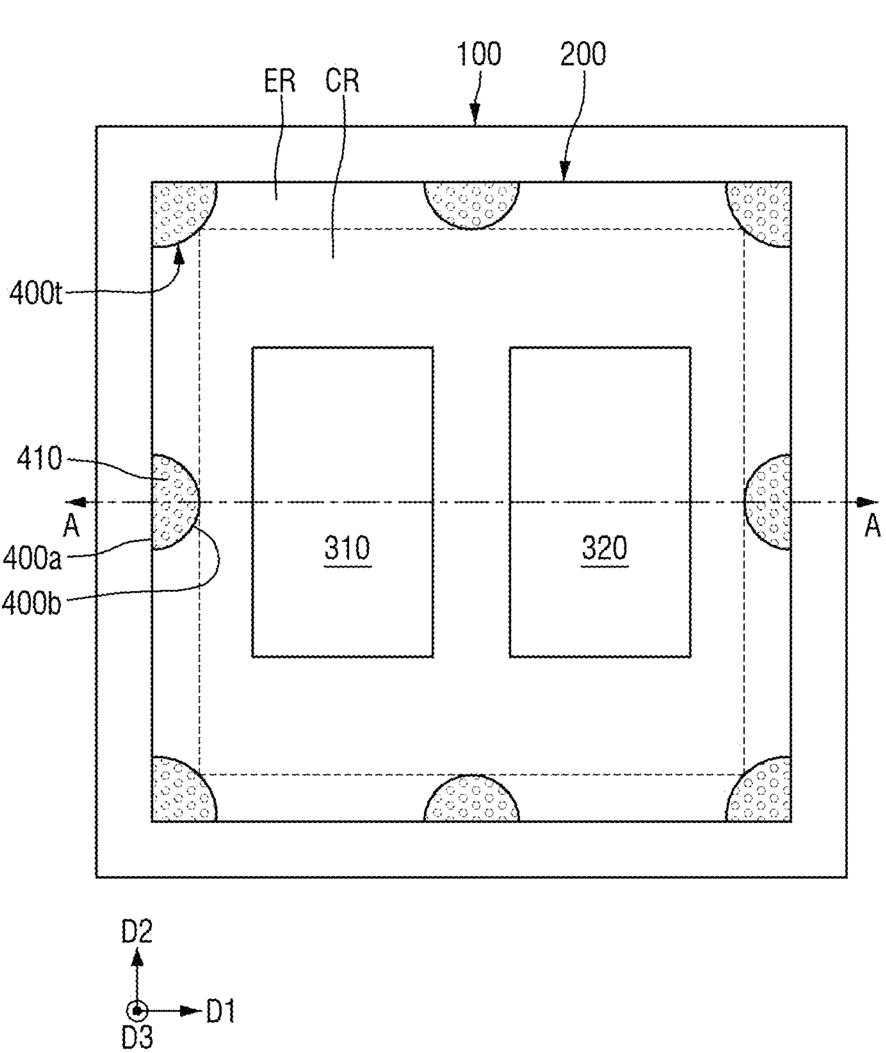
FIG. 1 is a plan view of a semiconductor package according to some embodiments of the disclosure.
Figure 2:
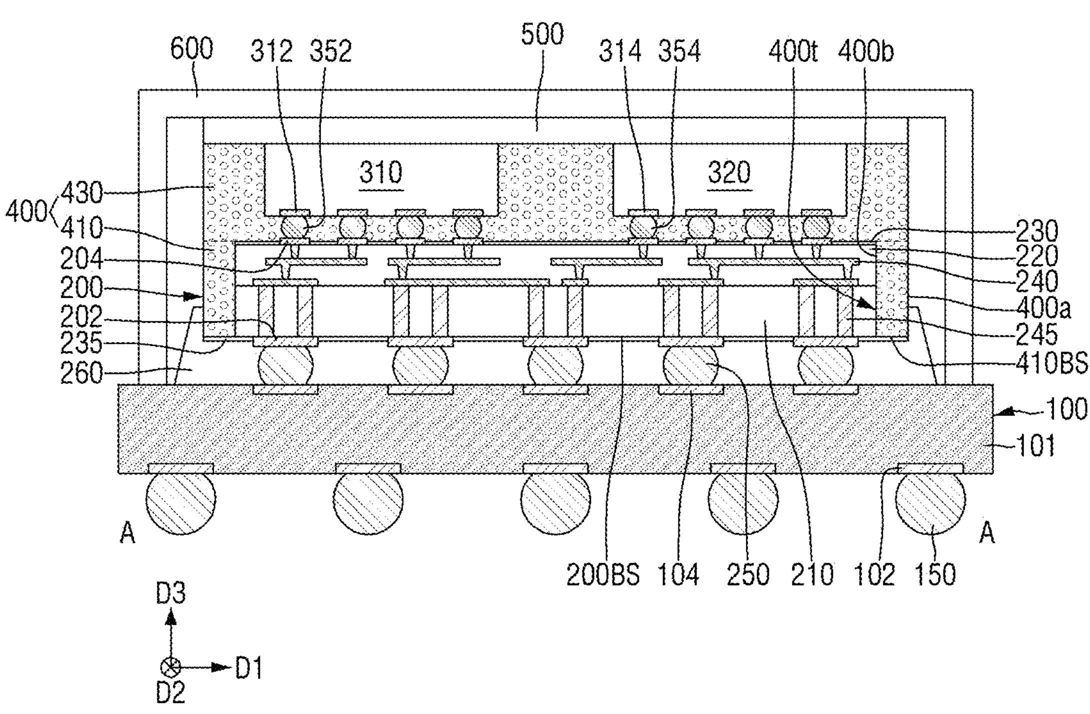
FIG. 2 is a cross-sectional view taken along a line A-A of FIG. 1.

A semiconductor package according to some embodiments of the present disclosure will be described below with reference to FIGS. 1 and 2. In FIGS. 1 and 2, the semiconductor package according to some embodiments may be a 2.5D package. However, this is merely an example, and technical ideas of the present disclosure are not limited thereto.

FIG. 1 is a plan view of a semiconductor package according to some embodiments of the disclosure. FIG. 2 is a cross-sectional view taken along a line A-A of FIG. 1.

Referring to FIGS. 1 and 2, a semiconductor package according to some embodiments may include a circuit board 100, an interposer structure 200, a first semiconductor chip 310, a second semiconductor chip 320, and a mold layer 400.

The first semiconductor chip 310 and the second semiconductor chip 320 may be spaced apart from each other in a first direction D1. In this specification, the first direction D1, a second direction D2, and a third direction D3 may intersect each other. The first direction D1, the second direction D2 and the third direction D3 may be substantially perpendicular to each other. Although FIG. 1 shows that there is one first semiconductor chip 310 and one second semiconductor chip 320, the embodiment is not limited thereto. A semiconductor package according to some embodiments may include a first semiconductor chip 310 and a plurality of second semiconductor chips 320.

The circuit board 100 may be a packaging board. The circuit board 100 may be a printed circuit board (PCB). The circuit board 100 may include a lower side and an upper side that are opposite to each other. The upper side of the circuit board 100 may face the interposer structure 200.

The circuit board 100 may include an insulating core 101, a first board pad 102, and a second board pad 104. The first board pad 102 and the second board pad 104 may each used to electrically connect the circuit board 100 to other components. For example, the first board pad 102 may be exposed from a lower side of the insulating core 101, and the second board pad 104 may be exposed from an upper side of the insulating core 101. The first board pad 102 and the second board pad 104 may include, for example, but are not limited to, metal materials such as copper (Cu) or aluminum (Al).

Although not shown, wiring patterns for electrically connecting the first board pads 102 and the second board pads 104 may be formed inside the insulating core 101. Although the insulating core 101 is shown to be a single layer, this is only for convenience of explanation. For example, it goes without saying that the insulating core 101 is made up of multiple layers, and multiple layers of wiring patterns may be formed therein.

The circuit board 100 may be mounted on a motherboard of an electronic device or the like. For example, a connection terminal 150 connected to the first board pad 102 may be provided. The circuit board 100 may be mounted on a motherboard of an electronic device or the like through the connection terminals 150. The circuit board 100 may be, but is not limited to, a BGA (Ball Grid Array) board.

The connection terminal 150 may be, for example, but is not limited to, solder bumps. The connection terminal 150 may have various shapes such as a land, a ball, a pin, and a pillar. Of course, the number, interval, placement and the like of the connection terminals 150 are not limited to those shown in the drawings, and may vary depending on the design.

In some embodiments, the insulating core 101 may include an organic matter. For example, the insulating core 101 may include pre-preg. The pre-preg is a composite fiber in which reinforcing fibers such as carbon fiber, glass fiber or aramid fiber are pre-impregnated with a thermosetting polymer binder (e.g., epoxy resin) or thermoplastic resin.

In some embodiments, the circuit board 100 may include a copper clad laminate (CCL). For example, the circuit board 100 may have a structure in which a copper laminate is stacked on a single side or on both sides of a thermoset pre-preg (e.g., C-stage pre-preg).

The interposer structure 200 may be placed on the upper side of the circuit board 100. The interposer structure 200 may include a lower side and an upper side that are opposite to each other. The upper side of the interposer structure 200 may face the first and second semiconductor chips 310 and 320. The lower side of the interposer structure 200 may face the circuit board 100. The lower side of the interposer structure 200 may be referred to as a bottom surface 200BS of the interposer structure 200. The bottom surface 200BS of the interposer structure 200 may be placed on the same plane as a bottom surface 410BS of a penetrating portion 410 of a mold layer 400, which will be described later. The interposer structure 200 facilitates connection between the circuit board 100 and the first and second semiconductor chips 310 and 320 to be described below, and may limit and/or prevent warpage of the semiconductor package.

In some embodiments, the interposer structure 200 may include an interposer 210, an interlayer insulating layer 220, a first passivation film 230, a second passivation film 235, redistribution layers 240, a through via 245, a first interposer pad 202, and a second interposer pad 204.

The interposer 210 may be provided on the circuit board 100. The interposer 210 may be, for example, but is not limited to, a silicon (Si) interposer. The interlayer insulating layer 220 may be placed on the interposer 210. The interlayer insulating layer 220 may include an insulating material. For example, the interlayer insulating layer 220 may include, but is not limited to, at least one of silicon oxide, silicon nitride, silicon oxynitride, and a low dielectric constant (low-k) material having a dielectric constant lower than that of silicon oxide.

The first interposer pad 202 and the second interposer pad 204 may each be used to electrically connect the interposer structure 200 with other components. For example, the first interposer pad 202 may be exposed from the bottom surface 200BS of the interposer structure 200, and the second interposer pad 204 may be exposed from the upper side of the interposer structure 200. The first interposer pad 202 and the second interposer pad 204 may include, for example, but are not limited to, metal materials such as copper (Cu) or aluminum (Al). Wiring patterns for electrically connecting the first interposer pad 202 and the second interposer pad 204 may be formed inside the interposer structure 200.

For example, the redistribution layers 240 and the through vias 245 may be formed inside the interposer structure 200.

The redistribution layers 240 may be placed inside the interlayer insulating layer 220. The through vias 245 may penetrate the interposer 210. The redistribution layers 240 and the through vias 245 may be connected to each other. The redistribution layers 240 may be electrically connected to the second interposer pad 204. The through vias 245 may be electrically connected to the first interposer pads 202. Therefore, the interposer structure 200, the first semiconductor chip 310, and the second semiconductor chip 320 may be electrically connected. The redistribution layers 240 and the through vias 245 may each include, but are not limited to, metal materials such as copper (Cu) or aluminum (Al).

The interposer structure 200 may be mounted on the upper side of the circuit board 100. For example, first solder balls 250 may be formed between the circuit board 100 and the interposer structure 200. The first solder balls 250 may connect the second substrate pads 104 and the first interposer pads 202. Therefore, the circuit board 100 and the interposer structure 200 may be electrically connected to each other.

The first solder balls 250 may be solder bumps including, for example, but are not limited to, low melting point metals, such as tin (Sn) and tin (Sn) alloys. The first solder balls 250 may have various shapes such as a land, a ball, a pin, and a pillar. The first solder balls 250 may be formed of a single layer or multiple layers. When the first solder balls 250 are formed of a single layer, the first solder balls 250 may include tin-silver (Sn—Ag) solder or copper (Cu). When the first solder balls 250 are formed of the single layer, the first solder ball 250 may include, for example, tin-silver (Sn—Ag) solder or copper (Cu). When the first solder balls 250 are formed of the multiple layers, the first solder balls 250 may include, for example copper (Cu) filler and solder. Of course, the number, interval, placement form, and the like of the first solder balls 250 are not limited to those shown in the drawings, and may vary depending on the design.

The first passivation film 230 may be placed on the interlayer insulating layer 220. The first passivation film 230 may extend long along the upper side of the interlayer insulating layer 220. The second interposer pad 204 penetrates the first passivation film 230, and may be connected to the redistribution layers 240. The second passivation film 235 may be placed on the interposer 210. The second passivation film 235 may extend along the bottom surface 200BS of the interposer 210. The second passivation film 235 may cover the bottom surface 410BS of the penetrating portion 410 of the mold layer 400, which will be described below. The first interposer pad 202 penetrates the second passivation film 235 and may be connected to the through via 245.

In some embodiments, the height of the first passivation film 230 in the third direction D3 may be smaller than the height of the second interposer pad 204 in the third direction D3. The second interposer pad 204 may protrude beyond the first passivation film 230 in the third direction D3. The height of the second passivation film 235 in the third direction D3 may be smaller than the height of the first interposer pad 202 in the third direction D3. The first interposer pad 202 may protrude beyond the second passivation film 235 in the third direction D3. However, technical ideas of the present disclosure are not limited thereto.

The first passivation film 230 and the second passivation film 235 may each include silicon nitride. In contrast, the first passivation film 230 and the second passivation film 235 may be each made up of a passivation material, a BCB (benzocyclobutene), polybenzeneoxazole, polyimide, epoxy, silicon oxide, silicon nitride or a combination thereof.

In some embodiments, an underfill 260 may be formed between the circuit board 100 and the interposer structure 200. The underfill 260 may fill a space between the circuit board 100 and the interposer structure 200. Also, the underfill 260 may cover the first solder ball 250. The underfill 260 may limit and/or prevent cracking or the like of the interposer structure 200, by fixing the interposer structure 200 onto the circuit board 100. The underfill 260 may include, for example, but is not limited to, an insulating polymeric material such as an EMC (epoxy molding compound).

In some embodiments, the interposer structure 200 may include an edge region ER and a center region CR. The center region CR may be defined by the edge region ER. A first semiconductor chip 310 and a second semiconductor chip 320 may be mounted on the center region CR of the interposer structure 200. A trench **400*t* may be formed in the edge region ER. The trench 400*t* may be formed in the interposer structure 200. A part of the mold layer 400 may be placed inside the trench 400*t*. Specifically, the penetrating portion 410 of the mold layer 400 may be placed inside the trench 400*t***.

The trench **400*t* may include a first side 400*a* and a second side 400*b*. In FIG. 1, from a planar viewpoint, the shape of the trench 400*t* may have a closed curve shape in which the first side 400*a* and the second side 400*b* are connected. The first side 400*a* may be opposite to the first semiconductor chip 310 and the second semiconductor chip 320. The second side 400*b* may face the first semiconductor chip 310 and the second semiconductor chip 320. In some embodiments, the first side 400*a* may be a flat surface, and the second side 400*b* may be a curved surface. That is, from a planar viewpoint, the first side 400*a* may be a straight line and the second side 400*b*** may be a curved line.

The first side **400*a* may be placed alongside one side wall of the interposer structure 200. The second side 400*b* may be concave with respect to the first side 400*a*. That is, from a planar viewpoint, a distance between the first side 400*a* and the second side 400*b* may increase and then decrease from one end of the first side 400*a* toward the other end of the first side 400*a***. However, technical ideas of the present disclosure are not limited thereto.

In some embodiments, the edge region ER includes a vertex region, and a remaining region except the vertex. Although the trench **400*t*** may be formed in each of the vertex region of the edge region ER and the remaining region, technical ideas of the present disclosure are not limited thereto.

The first semiconductor chip 310 and the second semiconductor chip 320 may be spaced apart from each other in the first direction D1 and placed on the upper side of the interposer structure 200. The first semiconductor chip 310 and the second semiconductor chip 320 may be spaced apart in a direction parallel to the bottom surface 200BS of the mutual interposer structure 200. The first semiconductor chip 310 and the second semiconductor chip 320 may each be an integrated circuit (IC) in which hundreds to millions of semiconductor elements are integrated in a single chip.

In some embodiments, the first semiconductor chip 310 may be a logic chip. For example, the first semiconductor chip 310 may be, but is not limited to, an application processor (AP), such as a CPU (Central Processing Unit), a GPU (Graphic Processing Unit), an FPGA (Field-Programmable Gate Array), a digital signal processor, an encryption processor, a microprocessor, a micro-controller, and an ASIC (Application-Specific IC).

In some embodiments, the second semiconductor chip 320 may be a memory chip. For example, the second semiconductor chip 320 may be a volatile memory such as a DRAM (dynamic random access memory) or a SRAM (static random access memory), or a non-volatile memory such as a flash memory, a PRAM (phase-change random access memory), a MRAM (Magnetoresistive Random Access Memory), a FeRAM (Ferroelectric Random Access Memory) or a RRAM (Resistive Random Access Memory).

As an example, the first semiconductor chip 310 may be an ASIC such as a GPU, and the second semiconductor chip 320 may be a stack memory, such as a high bandwidth memory (HBM). Such a stack memory may have a form in which a plurality of integrated circuits are stacked. The stacked integrated circuits may be electrically connected to each other through a TSV (Through Silicon Via) or the like.

The first semiconductor chip 310 may include first chip pads 302. The first chip pads 302 may be used to electrically connect the first semiconductor chip 310 to other components. For example, the first chip pads 302 may be exposed from the lower side of the first semiconductor chip 310.

The second semiconductor chip 320 may include second chip pads 314. The second chip pads 314 may be used to electrically connect the second semiconductor chip 320 to other components. For example, the second chip pads 314 may be exposed from the lower side of the second semiconductor chip 320.

The first chip pads 302 and the second chip pads 314 may each include, for example, but are not limited to, metal materials such as copper (Cu) or aluminum (Al).

The first semiconductor chip 310 and the second semiconductor chip 320 may be mounted on the upper side of the interposer structure 200. For example, second solder balls 352 may be formed between the interposer structure 200 and the first semiconductor chip 310. The second solder balls 352 may connect some of the plurality of second interposer pads 204 and the first chip pads 302. Therefore, the interposer structure 200 and the first semiconductor chip 310 may be electrically connected.

Further, for example, third solder balls 354 may be formed between the interposer structure 200 and the second semiconductor chip 320. The third solder balls 354 may connect another parts of the plurality of second interposer pads 204 and the second chip pad 314. Therefore, the interposer structure 200 and the second semiconductor chip 320 may be electrically connected.

The second solder ball 352 and the third solder ball 354 may each be, but are not limited to, a solder bump including a low-melting point metal, for example, tin (Sn), tin (Sn) alloy, or the like. The second solder ball 352 and the third solder ball 354 may have various shapes such as a land, a ball, a pin, and a pillar, respectively. Further, the second solder ball 352 and the third solder ball 354 may each include a UBM (Under Bump Metallurgy).

The second solder ball 352 and the third solder ball 354 may each be formed of a single layer or multiple layers. When the second solder ball 352 and the third solder ball 354 are each formed of a single layer, the second solder ball 352 and the third solder ball 354 may each include tin-silver (Sn—Ag) solder or copper (Cu) as an example. When the second solder ball 352 and the third solder ball 354 are each formed of multiple layers, the second solder ball 352 and the third solder ball 354 may each include copper (Cu) pillar and solder as an example. However, technical ideas of the present disclosure are not limited thereto, and the number, interval, placement form, and the like of each of the second solder ball 352 and the third solder ball 354 are not limited to those shown in the drawings, and may of course vary depending on the design.

In some embodiments, a part of the redistribution layer 240 may electrically connect the second solder ball 352 and the third solder ball 354. For example, a part of the redistribution layer 240 may be connected to the second interposer pad 204 connected to the second solder ball 352, and may be connected to the second interposer pad 204 connected to the third solder ball 354. Accordingly, the first semiconductor chip 310 and the second semiconductor chip 320 may be electrically connected.

A mold layer 400 may be placed on the interposer structure 200. The mold layer 400 may be provided between the first semiconductor chip 310 and the second semiconductor chip 320. The mold layer 400 may be provided between the first semiconductor chip 310 and the interposer structure 200. The mold layer 400 may be provided between the second semiconductor chip 320 and the interposer structure 200. The mold layer 400 may separate the first semiconductor chip 310 and the second semiconductor chip 320 from each other.

In some embodiments, the mold layer 400 may include a penetrating portion 410 and a stack portion 430.

The penetrating portion 410 may be placed inside the trench 400*t*. The trench 400*t* may be formed in the interposer structure 200. The penetrating portion 410 may overlap the interposer 210, the interlayer insulating layer 220, the through via 245, and the redistribution layer 240 in the first direction D1 and/or the second direction D2. At least a part of the side walls of the penetrating portion 410 may be covered with an underfill 260. At least a part of the side walls of penetrating portion 410 may come into contact with the underfill 260.

In some embodiments, a bottom surface 410BS of the penetrating portion 410 may be located on the same plane as the bottom surface 200BS of the interposer structure 200. The penetrating portion 410 is formed in the trench 400*t*, and after that, the penetrating portion 410 and the interposer 210 may be grounded. Therefore, the bottom surface 410BS of the penetrating portion 410 is located on the same plane as the bottom surface 200BS of the interposer structure 200.

The second passivation film 235 may be placed on the bottom surface 200BS of the interposer structure 200 and the bottom surface 410BS of the penetrating portion 410. The second passivation film 235 may cover the bottom surface 410BS of the penetrating portion 410. Since the second passivation film 235 is formed after grinding the penetrating portion 410 and the interposer 210, the second passivation film 235 may cover the bottom surface 410BS of the penetrating portion 410.

The stack portion 430 may be placed on the penetrating portion 410. The stack portion 430 is placed on the interposer structure 200. The stack portion 430 may be placed in the edge region ER and the center region CR. The stack portion 430 may cover the first and second semiconductor chips 310 and 320.

In some embodiments, the stack portion 430 is placed between the first semiconductor chip 310 and the interposer structure 200. The stack portion 430 may cover the second solder ball 352. The stack portion 430 may wrap the side walls of the second solder balls 352. The stack portion 430 is placed between the second semiconductor chip 320 and the interposer structure 200. The stack portion 430 may cover the third solder balls 354. The stack portion 430 may wrap side walls of the third solder ball 354. That is, the mold layer 400 may cover the second and third solder balls 352 and 354. The upper side of the stack portion 430 may be placed on the same plane as the upper sides of the first and second semiconductor chips 310 and 320, but the embodiment is not limited thereto.

The mold layer 400 may include, for example, but is not limited to, an insulating polymer material such as an EMC. The mold layer 400 may include a material different from the first underfill 260. For example, the underfill 260 may include an insulating material having fluidity superior to the mold layer 400. Therefore, the underfill 260 may efficiently fill a narrow space between the circuit board 100 and the interposer structure 200.

In some embodiments, since the mold layer 400 is placed inside the trench 400*t*, no air trap is formed between the first semiconductor chip 310 and the interposer structure 200. Similarly, because the mold layer 400 is placed inside the trench 400*t*, no air trap is formed between the second semiconductor chip 320 and the interposer structure 200. Therefore, a semiconductor package with improved reliability may be manufactured.

The semiconductor package according to some embodiments may further include an adhesive layer 500 and a heat slug 600.

The adhesive layer 500 may be provided on the mold layer 400. The adhesive layer 500 may be provided on the first semiconductor chip 310 and the second semiconductor chip 320. The adhesive layer 500 may come into contact with the upper side 400US of the mold layer 400. The adhesive layer 500 may come into contact with the upper side 310US of the first semiconductor chip 310 and the upper side 320US of the second semiconductor chip 320. The adhesive layer 500 may bond and fix the mold layer 400, the first semiconductor chip 310, the second semiconductor chip 320, and the heat slug 600 to each other. The adhesive layer 500 may include an adhesive material. For example, the adhesive layer 500 may include a curable polymer. The adhesive layer 500 may include, for example, an epoxy-based polymer.

The heat slug 600 may be placed on the circuit board 100. The heat slug 600 may cover the first semiconductor chip 310 and the second semiconductor chip 320. The heat slug 600 may include, but is not limited to, a metal material.

Figure 3:
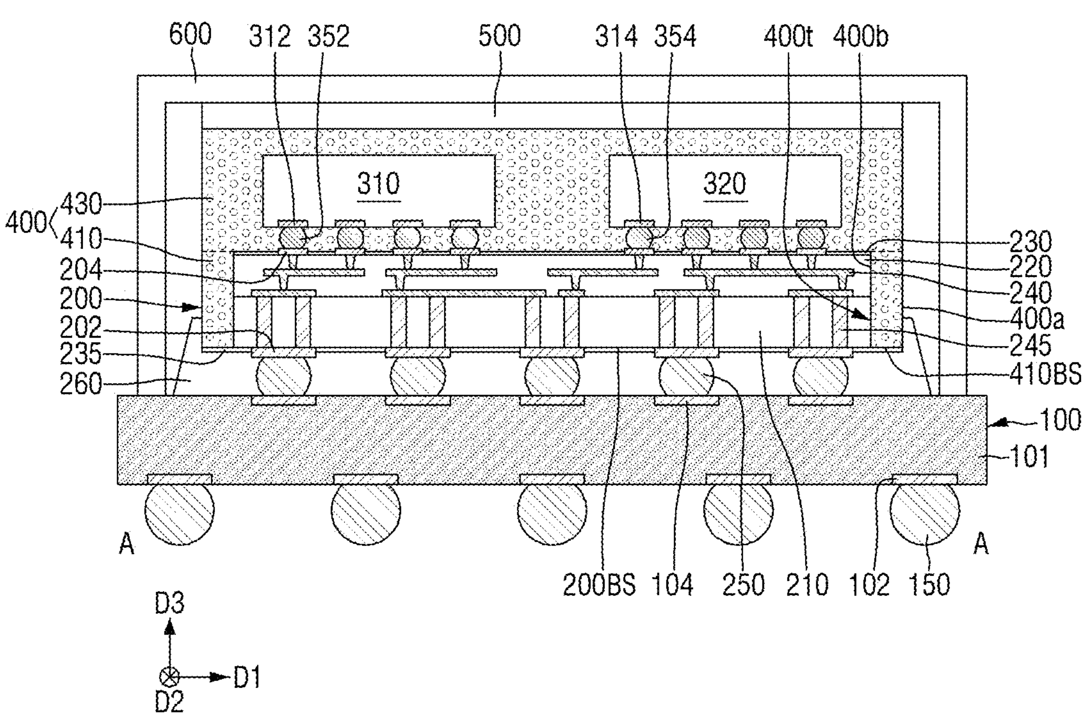
FIGS. 3 and 4 are example diagrams of a semiconductor package according to some embodiments.
Figure 4:
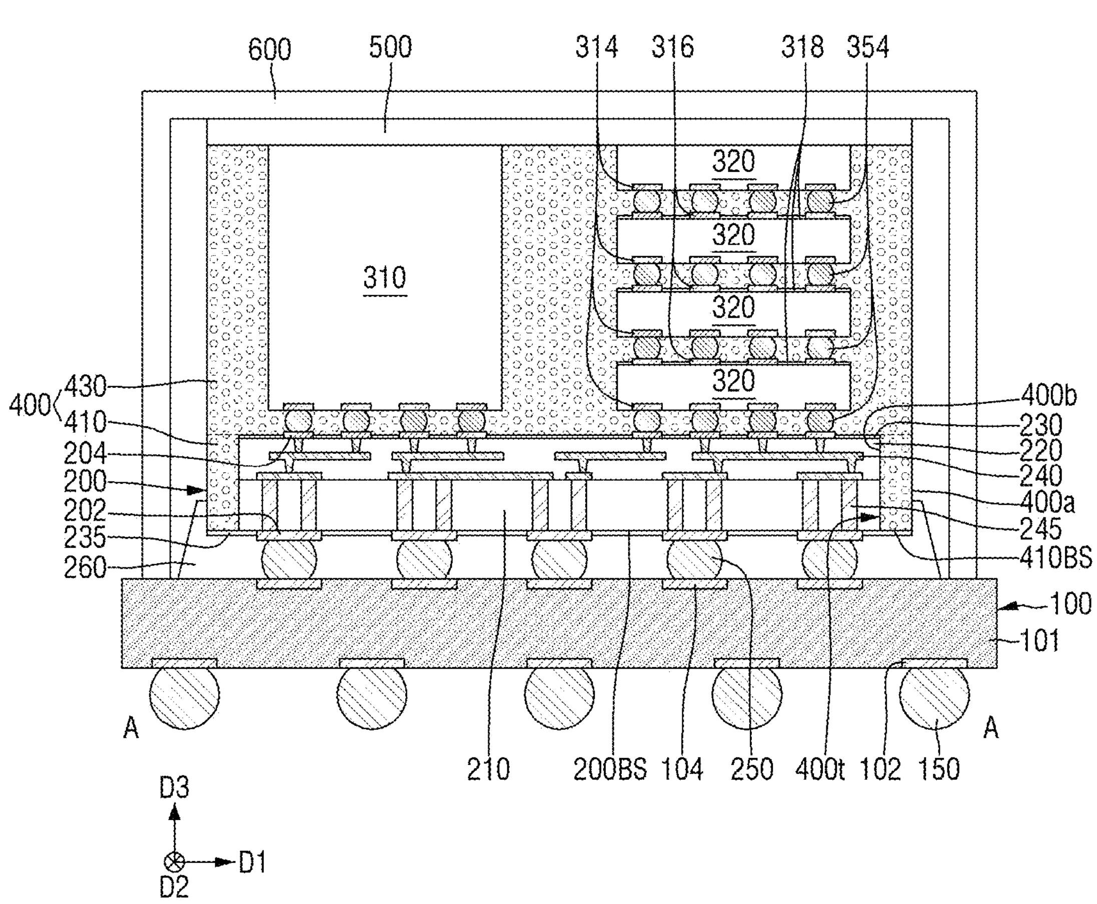

A semiconductor package according to some other embodiments of the present disclosure will be described below. FIGS. 3 and 4 are example diagrams of a semiconductor package according to some embodiments. For convenience of explanation, the repeated contents of those explained using FIGS. 1 and 2 will be omitted.

Referring to FIG. 3, the mold layer 400 may completely cover the first semiconductor chip 310 and the second semiconductor chip 320.

A height in the third direction D3 from the upper side of the interposer structure 200 to the upper side of the mold layer 400 is greater than a height in the third direction D3 from the upper side of the interposer structure 200 to the upper side of the first semiconductor chip 310. The height in the third direction D3 from the upper side of the interposer structure 200 to the upper side of the mold layer 400 is greater than the height in the third direction D3 from the upper side of the interposer structure 200 to the upper side of the second semiconductor chip 320.

The adhesive layer 500 may adhere better to the mold layer 400 than the first and second semiconductor chips 310 and 320. As the area of the mold layer 400 coming into contact with the adhesive layer 500 is increased, a semiconductor package having high stability can be provided.

Referring to FIG. 4, there may be at least one or more second semiconductor chips 320. That is, a memory chip included in the semiconductor package according to some embodiments may be a semiconductor package including a plurality of memory chips. For example, the second semiconductor chips 320 may be a stack memory such as a High Bandwidth Memory (HBM). The plurality of second semiconductor chips 320 may be spaced apart from each other in the third direction D3. Although four second semiconductor chips 320 are shown as being aligned in the third direction D3 in FIG. 4, the number of second semiconductor chips 320 is not limited thereto.

In some embodiments, each second semiconductor chip 320 may include second chip pads 314, third chip pads 316, third passivation films 318, and third solder balls 354.

The second chip pad 314 may be placed on the lower side of each second semiconductor chip 320. The third chip pad 316 may be placed on the upper side of each second semiconductor chip 320. However, the third chip pads 316 are not placed on the upper side of the second semiconductor chip 320 placed at the highest level. The third solder balls 354 may be placed between the second chip pad 314 and the third chip pad 316 and/or between the second chip pad 314 and the second interposer pad 204. The plurality of second semiconductor chips 320 may be connected together using the second chip pads 314, the third chip pads 316 and the third solder balls 354. The third chip pad 316 may include, but is not limited to, metal materials such as copper (Cu) or aluminum (Al).

The third passivation film 318 may extend long along the upper side of the second semiconductor chip 320. However, the third passivation film 318 is not placed on the second semiconductor chip 320 placed at the highest level. The third chip pad 316 may penetrate the third passivation film 318. The third passivation film 318 may include silicon nitride. In contrast, the third passivation film 318 may be made up of passivation material, BCB (benzocyclobutene), polybenzeneoxazole, polyimide, epoxy, silicon oxide, silicon nitride, or a combination thereof.

In some embodiments, the stack portion 430 of the mold layer 400 is filled between the first semiconductor chip 310 and the interposer structure 200. The stack portion 430 of the mold layer 400 may wrap the second solder balls 352. In addition, the stack portion 430 of the mold layer 400 may be filled between the second semiconductor chip 320 and the interposer structure 200 and/or between the second semiconductor chips 320 spaced apart from each other. The stack portion 430 of the mold layer 400 may wrap the third solder balls 354.

Since the mold layer 400 is placed inside the trenches 400*t*, no air trap is formed between the first semiconductor chip 310 and the interposer structure 200, between the second semiconductor chip 320 and the interposer structure 200, and/or between the second semiconductor chips 320.

Figure 5:
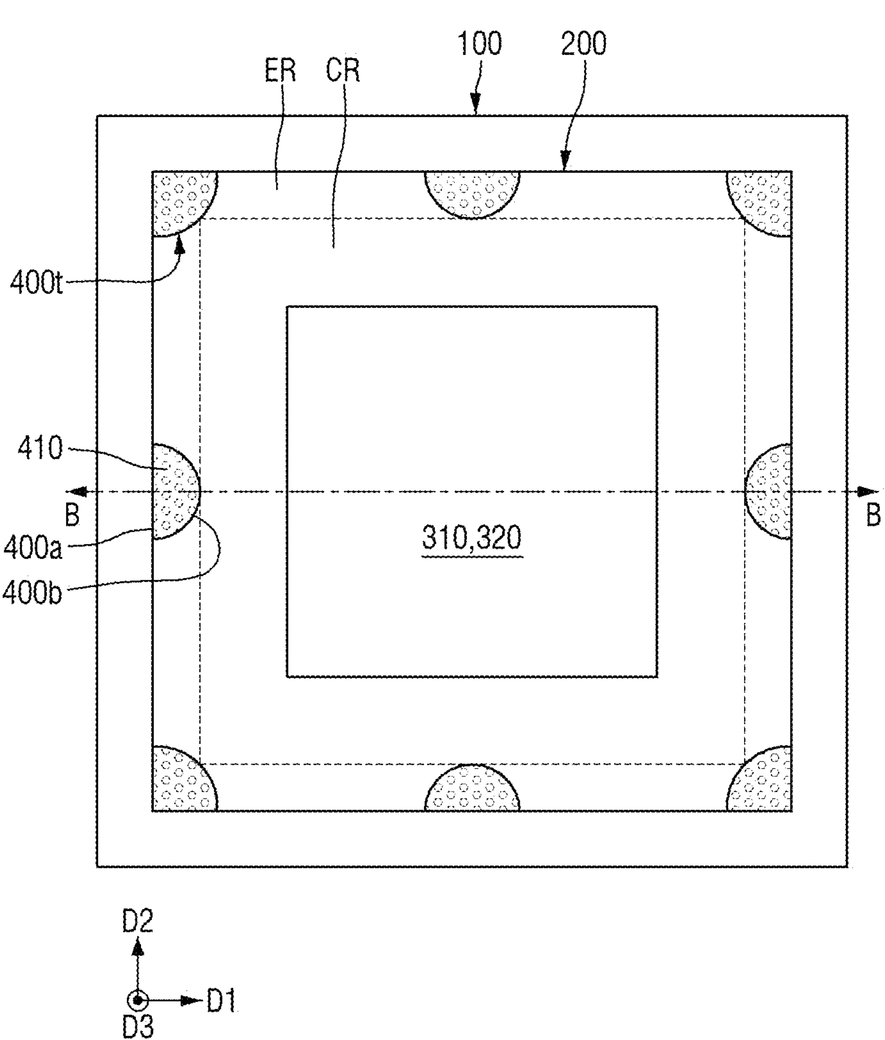
FIG. 5 is a plan view of a semiconductor package according to some other embodiments of the disclosure.
Figure 6:
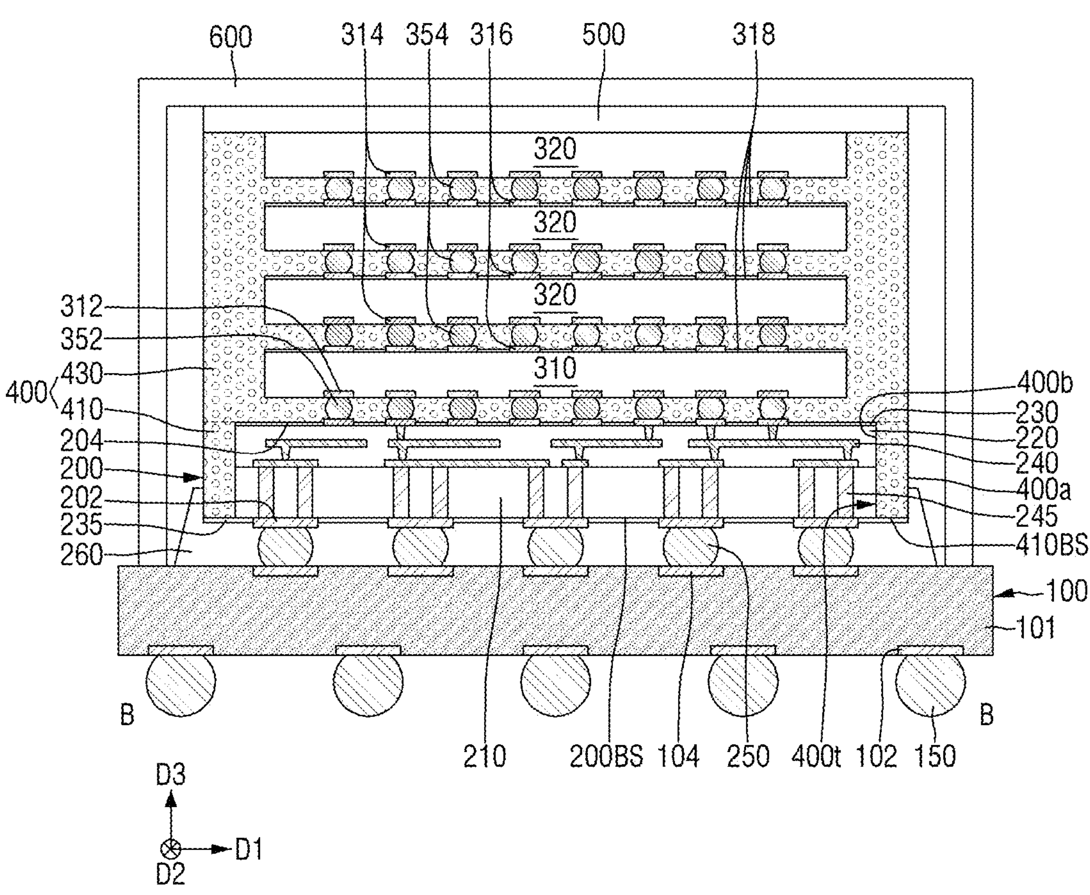
FIG. 6 is a cross-sectional view taken along a line B-B of FIG. 5.

FIG. 5 is a plan view of a semiconductor package according to some other embodiments of the disclosure. FIG. 6 is a cross-sectional view taken along a line B-B of FIG. 5. For convenience of explanation, repeated contents of those explained using FIGS. 1 and 2 will be omitted.

Referring to FIGS. 5 and 6, a semiconductor package according to some embodiments may include a circuit board 100, an interposer structure 200, a first semiconductor chip 310, and a second semiconductor chip 320.

The first semiconductor chip 310 and the plurality of second semiconductor chips 320 may be spaced apart from each other in the third direction D3. The third direction D3 may be perpendicular to the bottom surface 200BS of the interposer structure 200.

In some embodiments, the first semiconductor chip 310 may be a buffer die. The buffer die may also be called an interface die, a base die, a logic die, a master die, and the like. The plurality of second semiconductor chips 320 may be core dies. The core die may also be called a memory die, a slave die, or the like.

In some embodiments, the first semiconductor chip 310, that is, the buffer die, may include a physical layer and a direct access region. The physical layer of the first semiconductor chip 310 may include an interface circuit for communicating with an external host device, and may be electrically connected to the first semiconductor chip 310 through the interposer structure 200. The second semiconductor chip 320 may receive signals from the first semiconductor chip 310 or may transmit signal to the first semiconductor chip 310 through the physical layer. Signals and/or data received through the physical layer of the first semiconductor chip 310 may be transferred to the plurality of second semiconductor chips 320 through the third solder balls 354. The direct access region may provide an access path that may test the second semiconductor chip 320 without going through the first semiconductor chip 310. The direct access region may include a conductive means that allow direct communication with the external test device. In some embodiments, the second semiconductor chips 320, that is, each of the core dies, may include a memory cell array.

In some embodiments, each second semiconductor chip 320 may include second chip pads 314, third chip pads 316, third passivation film 318, and third solder balls 354.

The second chip pad 314 may be placed on the lower side of each second semiconductor chip 320. The third chip pad 316 may be placed on the upper side of each second semiconductor chip 320. However, the third chip pads 316 are not placed on the upper side of the second semiconductor chip 320 placed at the highest level. The third solder balls 354 may be placed between the second chip pads 314 and the third chip pads 316 and/or between the second chip pads 314 and the first semiconductor chip 310. The plurality of second semiconductor chips 320 may be connected together using the second chip pads 314, the third chip pads 316 and the third solder balls 354. The third chip pad 316 may include, but is not limited to, metal materials such as copper (Cu) or aluminum (Al).

The third passivation film 318 may extend long along the upper side of the second semiconductor chip 320. Also, the third passivation film 318 may extend long along the upper side of the first semiconductor chip 310. The third passivation film 318 is not placed on the upper side of the second semiconductor chip 320 placed at the highest level. The third chip pad 316 may penetrate the third passivation film 318. The third passivation film 318 may include silicon nitride. In contrast, the third passivation film 318 may be made up of a passivation material, BCB (benzocyclobutene), polybenzeneoxazole, polyimide, epoxy, silicon oxide, silicon nitride or a combination thereof.

In some embodiments, the stack portion 430 of the mold layer 400 is filled between the first semiconductor chip 310 and the interposer structure 200. The stack portion 430 of the mold layer 400 may wrap the second solder balls 352. In addition, the stack portion 430 of the mold layer 400 may be filled between the second semiconductor chip 320 and the first semiconductor chip 310 and/or between the second semiconductor chips 320 spaced apart from each other. The stack portion 430 of the mold layer 400 may wrap the third solder balls 354.

Since the mold layer 400 is placed inside the trench 400*t*, no air trap is formed between the first semiconductor chip 310 and the interposer structure 200, between the first semiconductor chip 310 and the second semiconductor chip 320, and/or between the second semiconductor chips 320.

Figure 7:
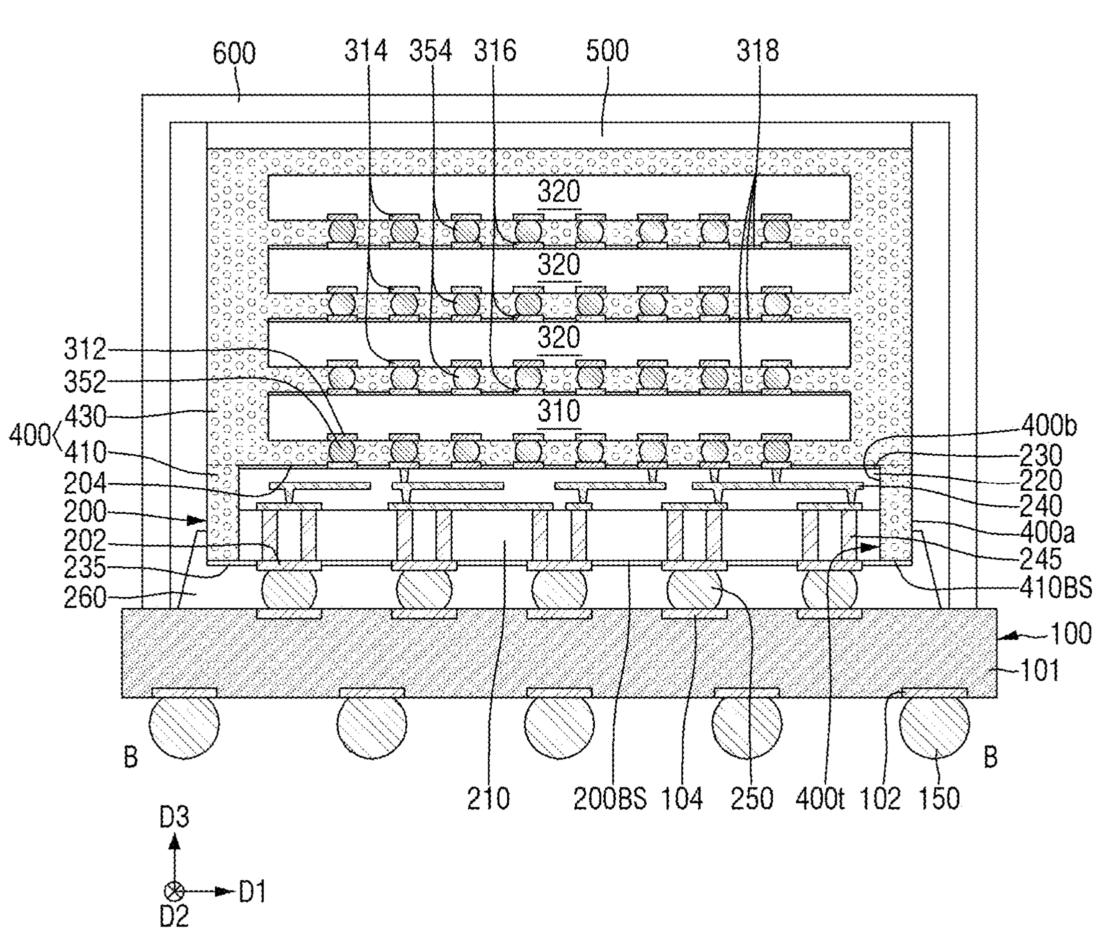
FIG. 7 is an example diagram of a semiconductor package according to some embodiments.

FIG. 7 is an example diagram of a semiconductor package according to some embodiments. Referring to FIG. 7, the mold layer 400 may completely cover the second semiconductor chip 320.

A height in the third direction D3 from the upper side of the interposer structure 200 to the upper side of the mold layer 400 is greater than a height in the third direction D3 from the upper side of the interposer structure 200 to the upper side of the second semiconductor chip 320.

The adhesive layer 500 may adhere better to the mold layer 400 than the second semiconductor chips 320. As the area of the mold layer 400 coming into contact with the adhesive layer 500 is increased, a semiconductor package having high stability can be provided.

FIGS. 8 to 11 are example diagrams of a semiconductor package according to some embodiments. For convenience of explanation, repeated contents of those explained using FIGS. 1 and 2 will be omitted.

Figure 8:
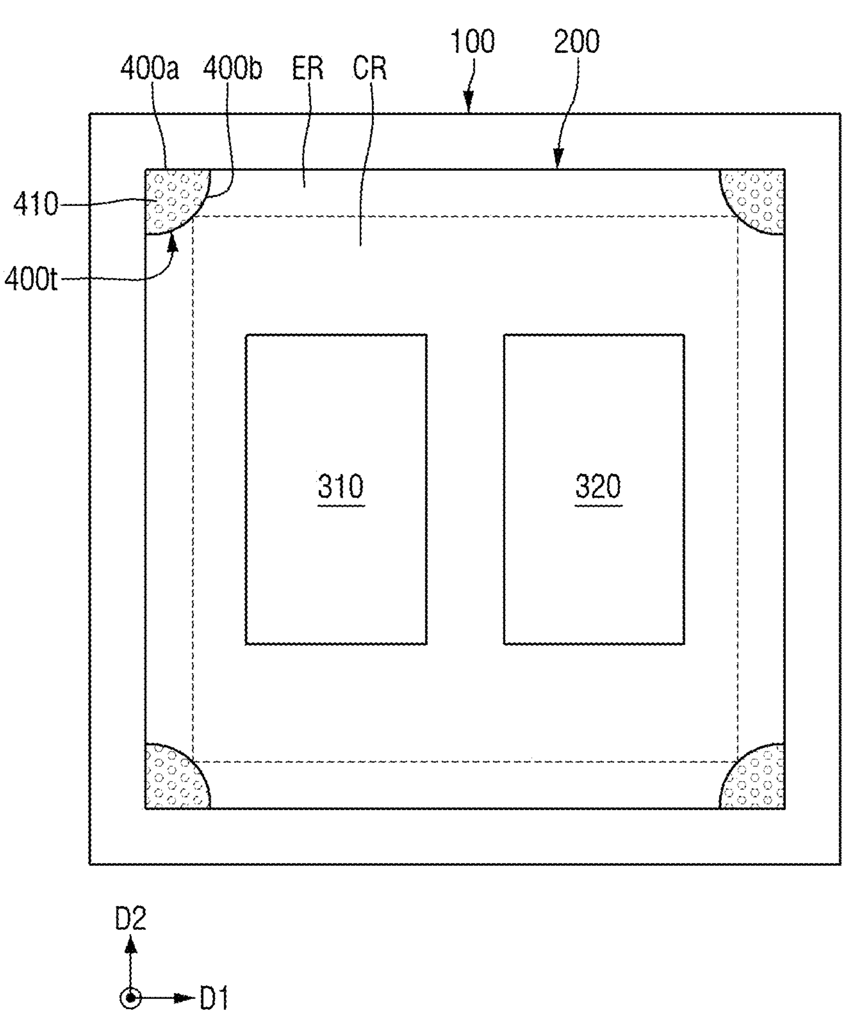
FIGS. 8 to 11 are example diagrams of a semiconductor package according to some embodiments.

Referring to FIG. 8, the edge region ER includes the vertex region and the remaining region except the vertex. From a planar viewpoint, the trench 400*t* is formed in the apex region, but may not be formed in the remaining region. That is, when the edge region ER has a square shape, four trenches 400*t* may be formed. A penetrating portion 410 of the mold layer 400 may be placed inside the trench 400*t*. The penetrating portion 410 may be placed only in the vertex region of the edge region ER.

Figure 9:
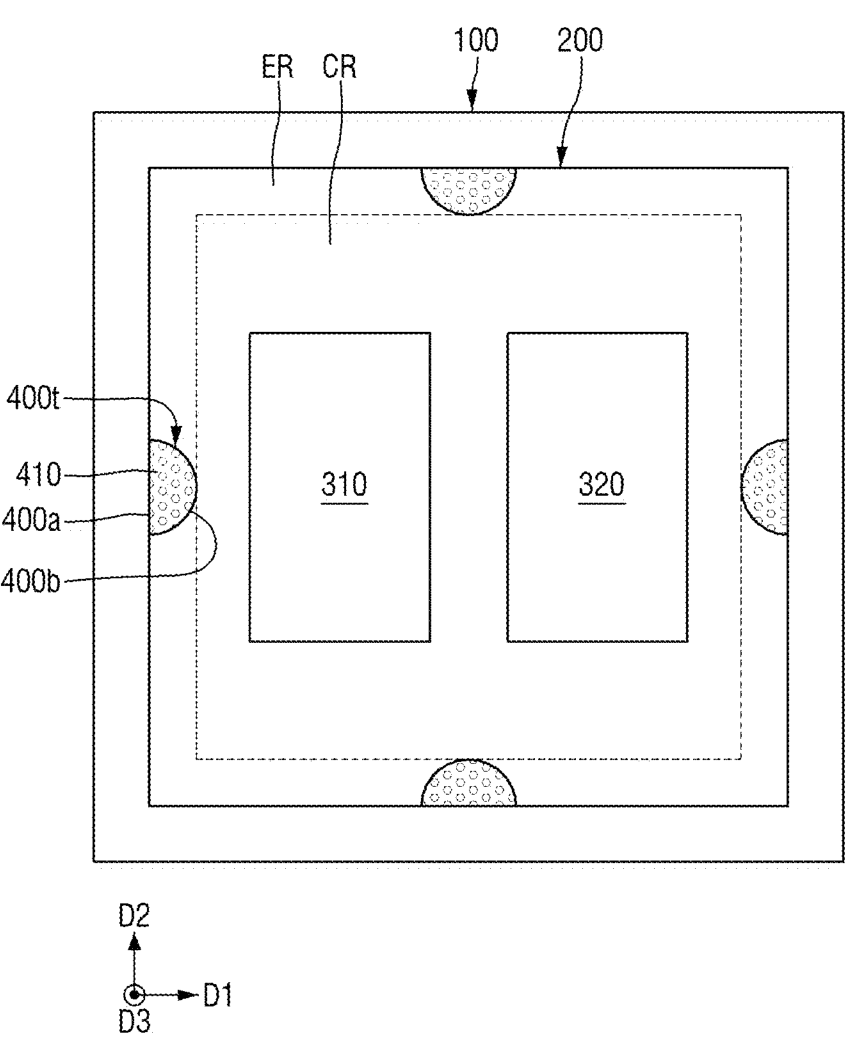

Referring to FIG. 9, from a planar viewpoint, the trenches 400*t* are formed in the remaining regions, but may not be formed in the apex region. That is, when the edge region ER has a square shape, four trenches 400*t* may be formed. The penetrating portion 410 of the mold layer 400 may be placed inside the trench 400*t*. The penetrating portion 410 may be placed only in the remaining region of the edge region ER.

Figure 10:
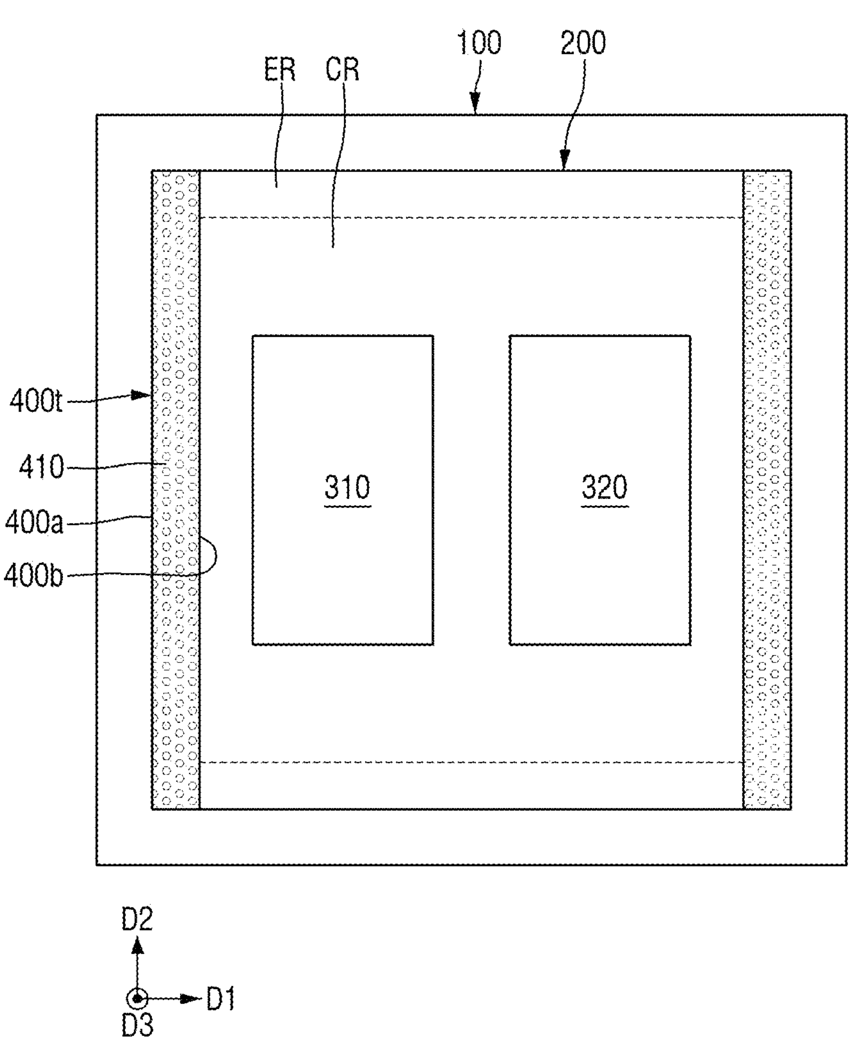

Referring to FIG. 10, the trench 400*t* may have a line shape from a planar viewpoint. That is, the trench 400*t* may extend in the second direction D2. The trench 400*t* may each be formed on one side and the other side of the edge region ER. Although the trench 400*t* is shown to extend in the second direction D2 in FIG. 10, technical ideas of the present disclosure are not limited thereto. Unlike that shown, the trench 400*t* may have a line shape extending in the first direction D1. Further, it goes without saying that the trench 400*t* may include a portion extending in the first direction D1 and a portion extending in the second direction D2. The penetrating portion 410 of the mold layer 400 may be placed inside the trench 400*t*. The penetrating portion 410 may have a line shape from a planar viewpoint. The penetrating portion 410 may extend in the second direction D2.

Figure 11:
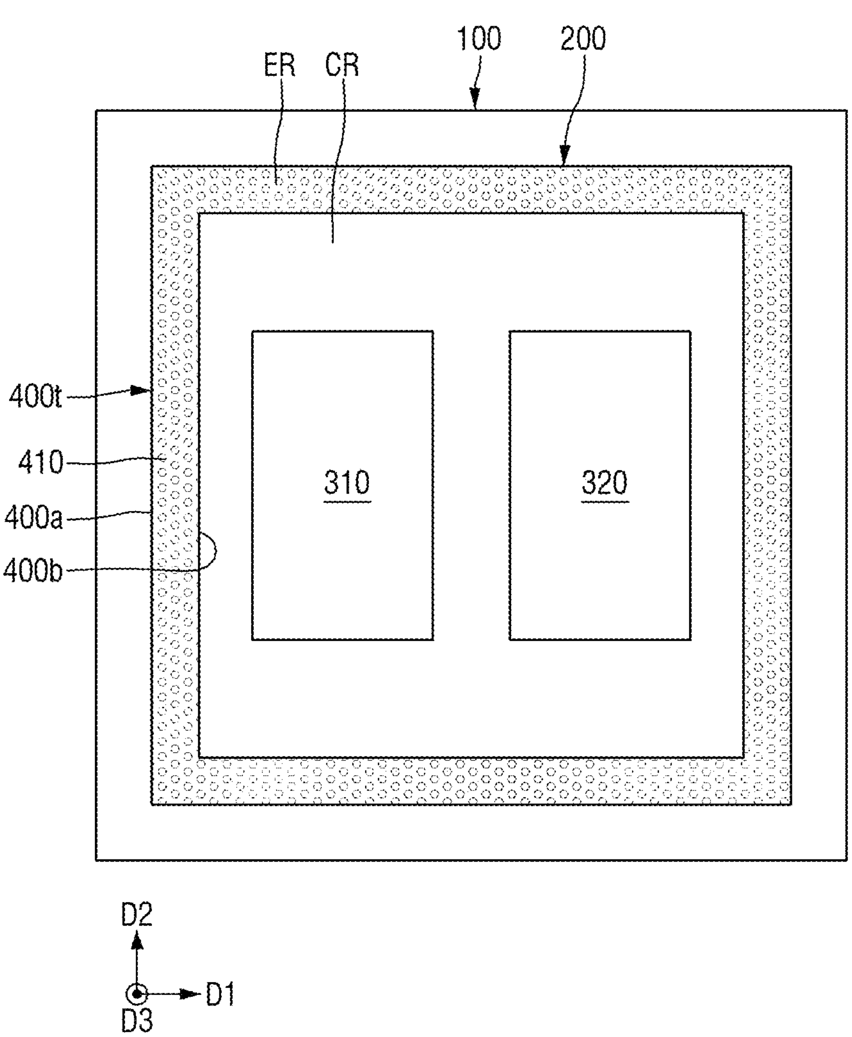

Referring to FIG. 11, the trench 400*t* may completely wrap the center region CR. For example, the trench 400*t* may be placed throughout the edge region ER. In an example, trench 400*t* may be a closed curve having a square shape from a planar viewpoint. The penetrating portion 410 of the mold layer 400 may be placed inside the trench 400*t*. The penetrating portion 410 may wrap the first and second semiconductor chips 310 and 320 from a planar viewpoint.

A method of manufacturing a semiconductor package according to some embodiments of the present disclosure will be described below. FIGS. 12 to 27 are diagrams sequentially showing processes of manufacturing the semiconductor package having the cross section of FIG. 2.

Figure 12:
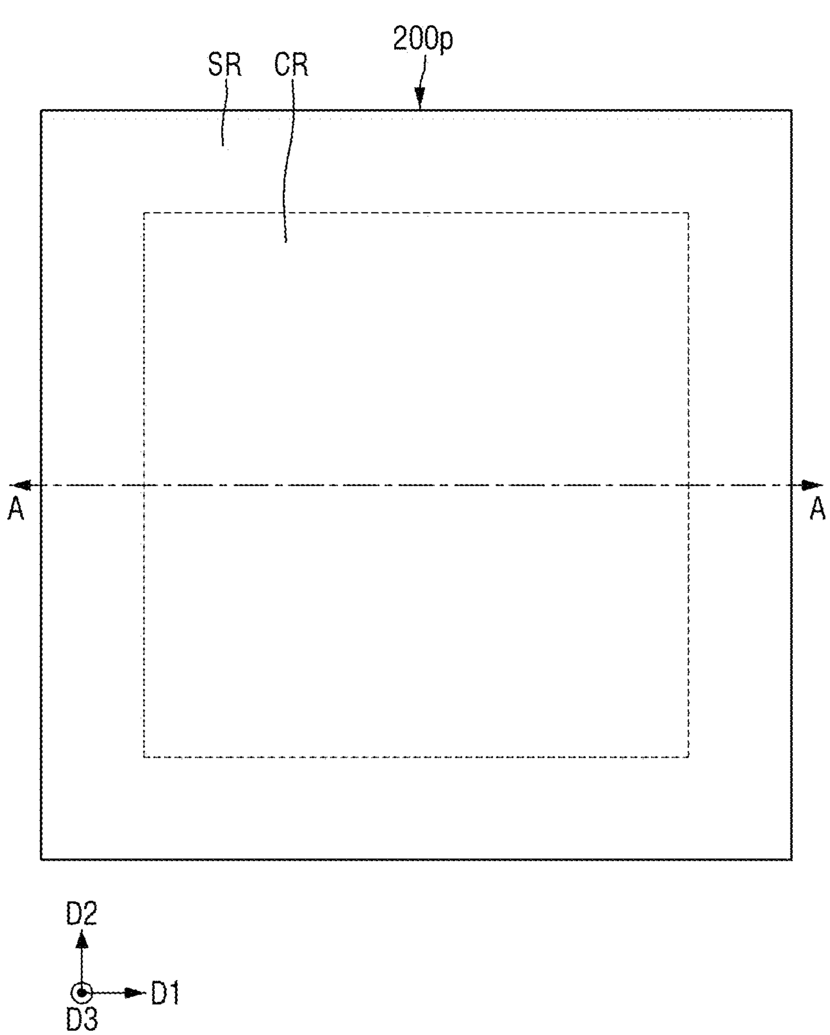
FIGS. 12 to 27 are diagrams sequentially showing processes of manufacturing the semiconductor package having the cross section of FIG. 2.
Figure 13:
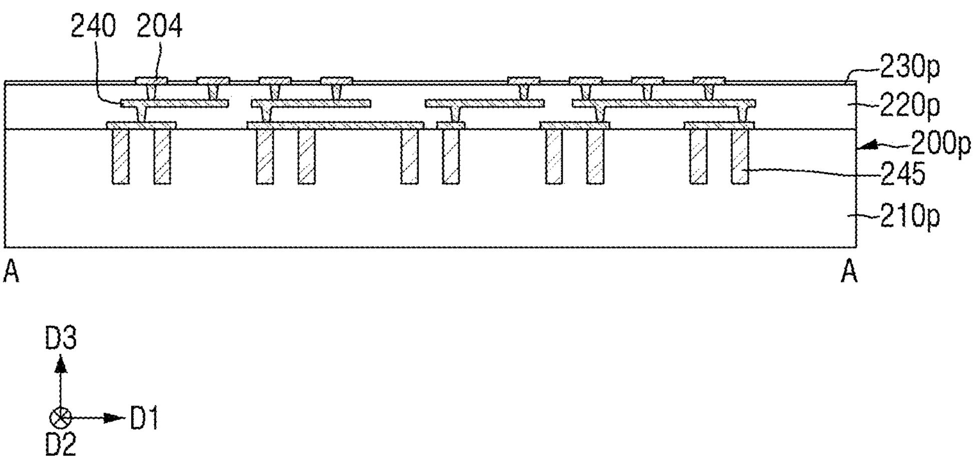

Referring to FIGS. 12 and 13, a pre-interposer structure 200*p* may be provided. The pre-interposer structure 200*p* may include a pre-interposer 210*p*, a pre-interlayer insulating layer 220*p*, a pre-first passivation film 230*p*, a through via 245, redistribution layers 240, and a second interposer pad 204.

In some embodiments, the pre-interposer structure 200*p* may include a scribe lane region SR and a center region CR. A width of the scribe lane region SR may be greater than a width of the edge region ER of FIG. 2. The scribe lane region SR may define the center region CR. The scribe lane region SR may wrap around the center region CR. The center region CR may be a region in which the first and second semiconductor chips 310 and 320 are mounted.

First, a pre-interposer 210*p* is provided. The pre-interposer 210*p* may be formed of, for example, silicon (Si). The through via 245 may be formed in the pre-interposer 210*p*. The through via 245 is formed in the pre-interposer 210*p*, but does not penetrate the pre-interposer 210*p*. That is, a bottom surface of the pre-interposer 210*p* is not located on the same plan as a bottom surface of the through via 245.

The pre-interlayer insulating layer 220*p* is formed on the pre-interposer 210*p* and the through via 245. The pre-interlayer insulating layer 220*p* may include, but is not limited to, at least one of silicon oxide, silicon nitride, silicon oxynitride, and a low dielectric constant (low-k) material having a lower dielectric constant than silicon oxide. The redistribution layers 240 may be formed inside the pre-interlayer insulating layer 220*p*.

A pre-first passivation film 230*p* and a second interposer pad 204 may be formed on the pre-interlayer insulating layer 220*p*. The second interposer pad 204 may penetrate the pre-first passivation film 230*p*. The pre-first passivation film 230*p* may include silicon nitride. In contrast, the pre-first passivation film 230*p* may be made up of a passivation material, BCB (benzocyclobutene), polybenzeneoxazole, polyimide, epoxy, silicon oxide, silicon nitride or a combination thereof.

Figure 14:
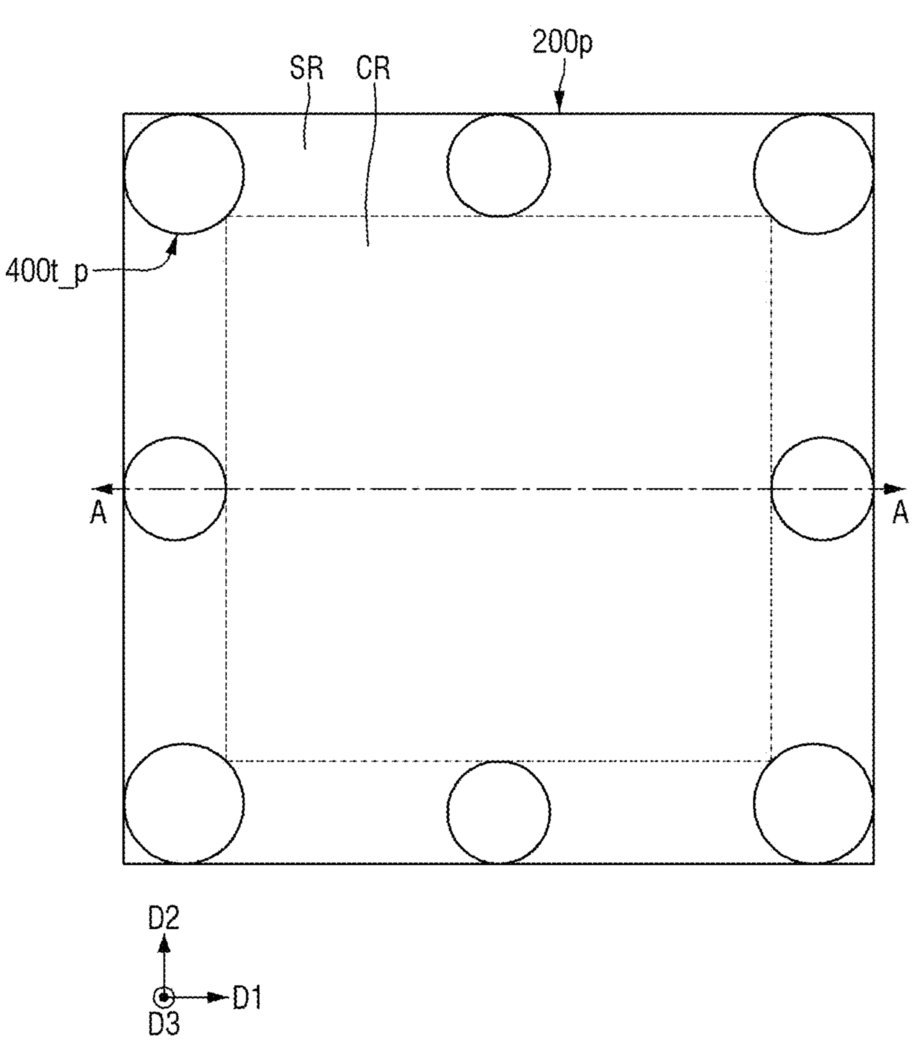
Figure 15:
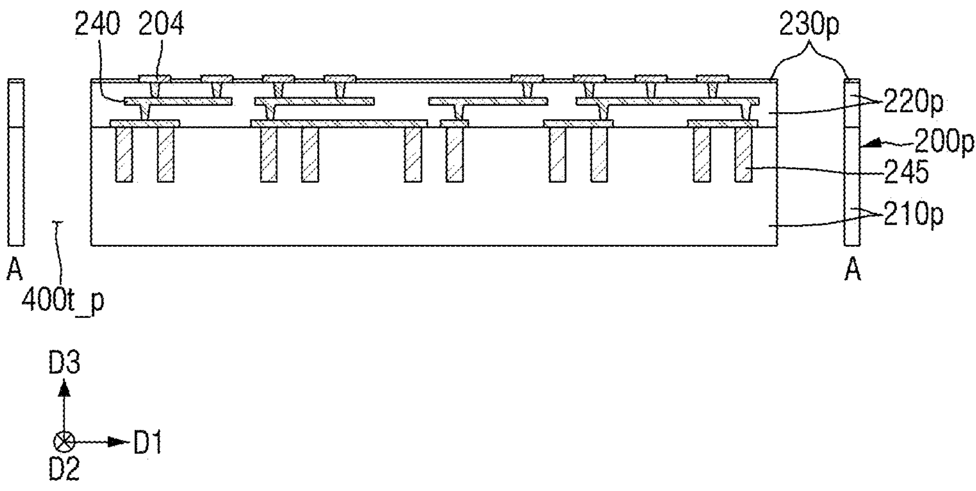

Referring to FIGS. 14 and 15, a plurality of pre-trenches 400*t*_p may be formed. The plurality of pre-trenches 400*t*_p may be formed in the scribe lane region SR. The plurality of pre-trenches 400*t*_p may be formed in the vertex region of the scribe lane region SR and the remaining region except the vertex region. The plurality of pre-trenches 400*t*_p may penetrate the pre-first passivation film 230*p*, the pre-interlayer dielectric layer 220*p*, and the pre-interposer 210*p*.

Although eight pre-trenches 400*t*_p are shown to be formed in FIG. 14, technical ideas of the present disclosure are not limited thereto. Also, although the shape of the pre-trench 400*t*_p is shown to be circular, the embodiment is not limited thereto. The number and shape of the pre-trenches 400*t*_p may be varied as much as possible depending on the design of the product.

Figure 16:
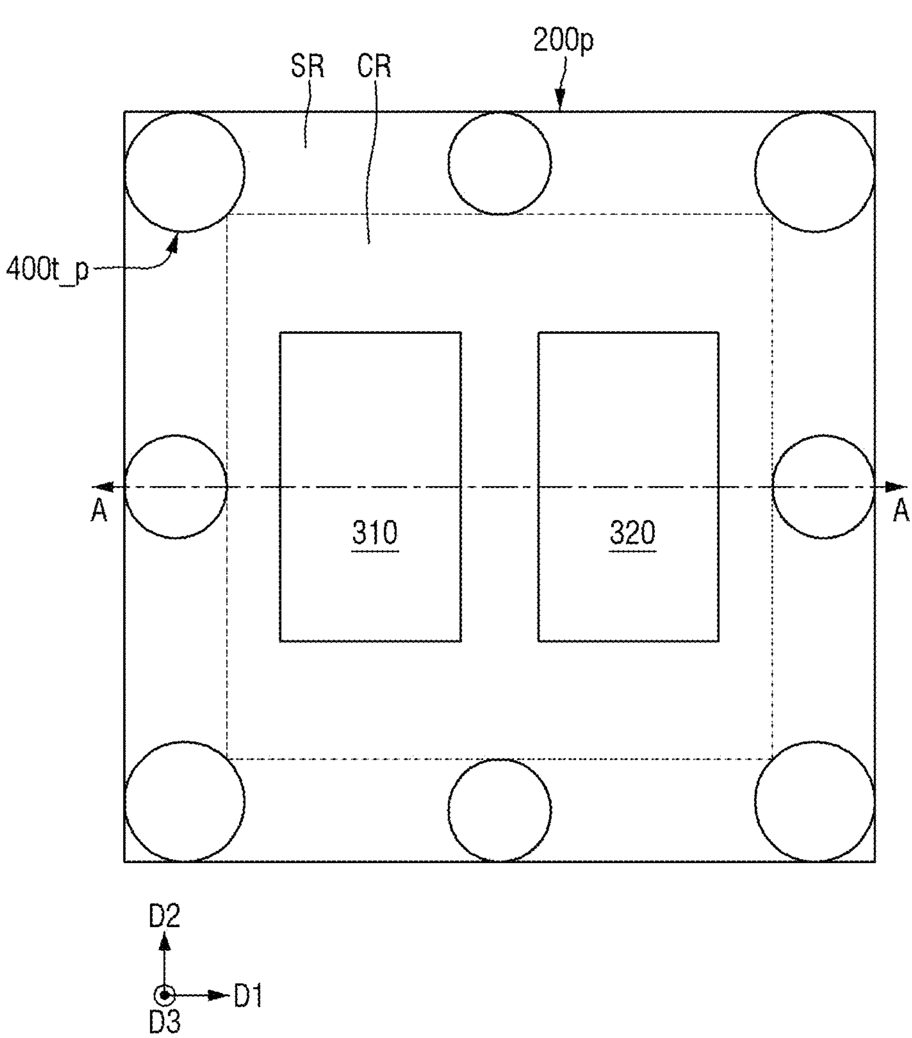
Figure 17:
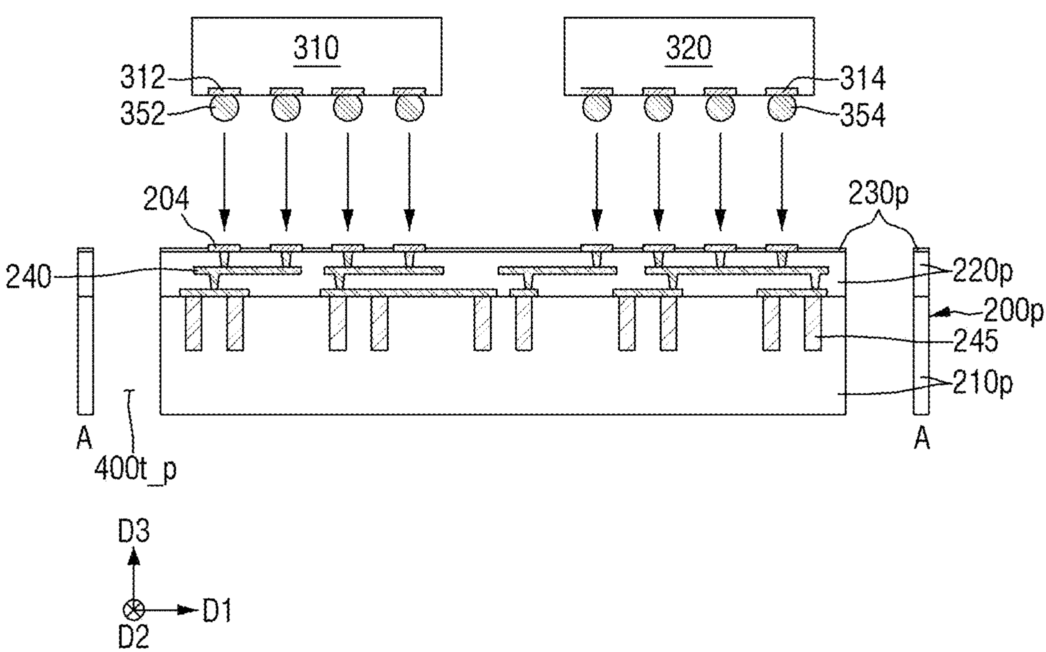
Figure 18:
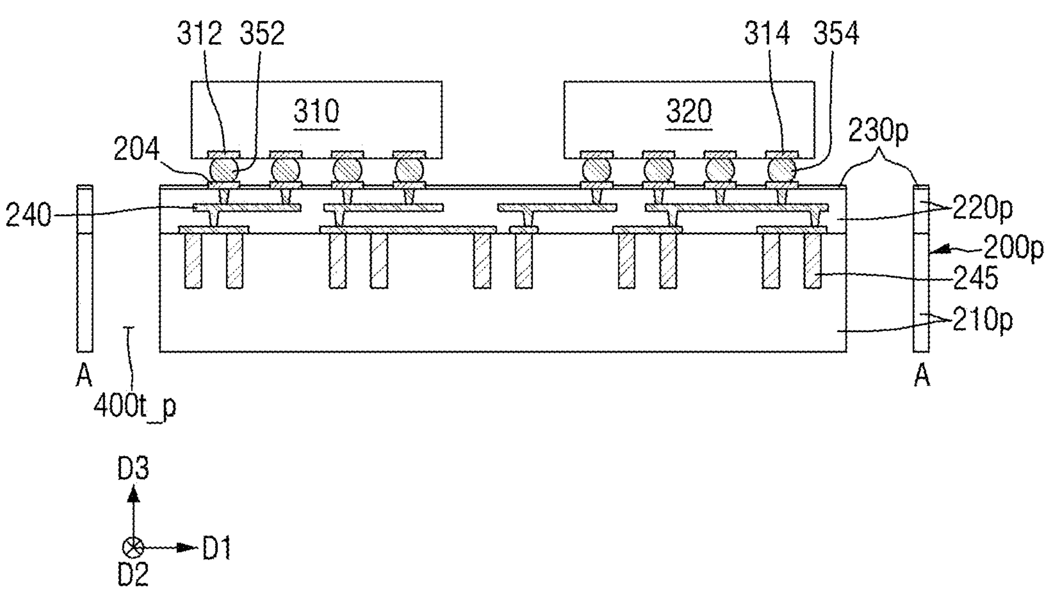

Referring to FIGS. 16 to 18, first and second semiconductor chips 310 and 320 may be mounted on the pre-interposer structure 200*p*. For example, the first and second semiconductor chips 310 and 320 may be mounted on the center region CR of the pre-interposer structure 200*p*.

For example, the first semiconductor chip 310 includes a first chip pad 312. The second solder ball 352 may be attached on the first chip pad 312. The second solder ball 352 may be attached to the second interposer pad 204. The second interposer pad 204 and the first chip pad 312 are electrically connected through the second solder ball 352. The second semiconductor chip 320 includes second chip pads 314. A third solder ball 354 may be attached on the second chip pad 314. The third solder ball 354 may be attached to the second interposer pad 204. The second interposer pads 204 and the second chip pads 314 are electrically connected through the third solder balls 354.

Figure 19:
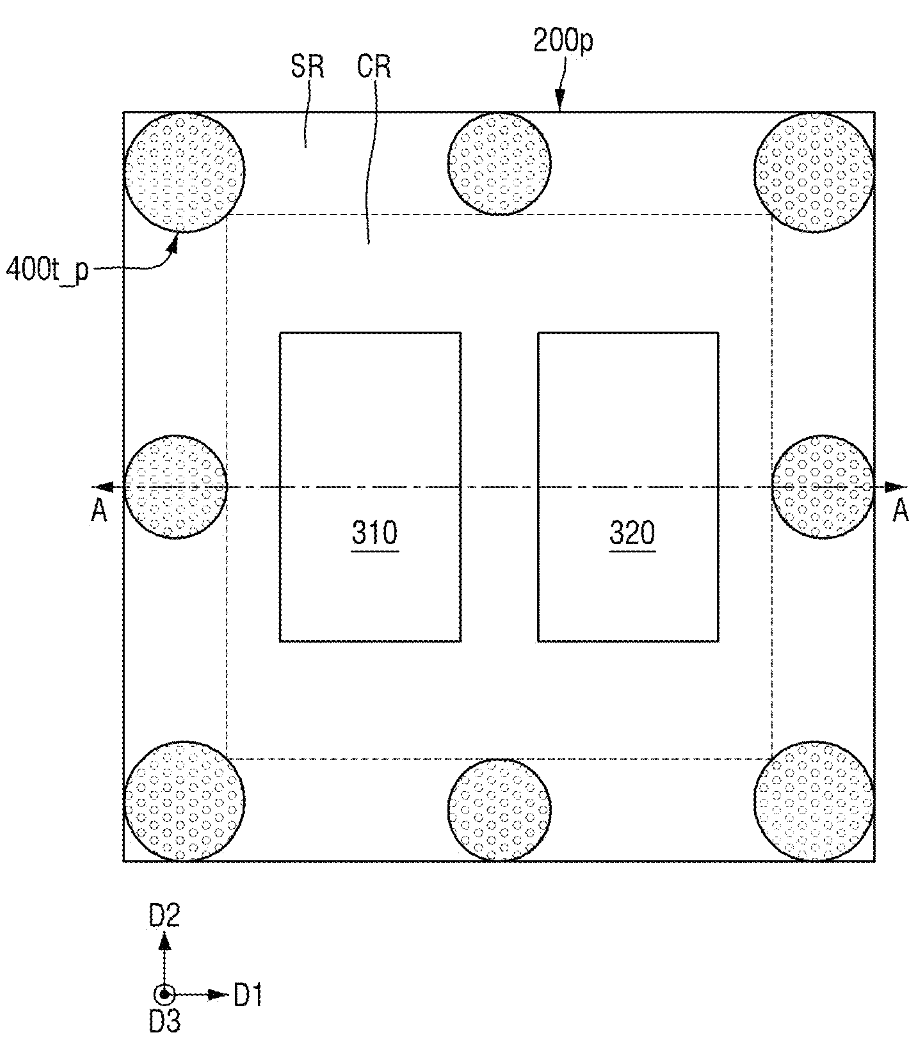
Figure 20:
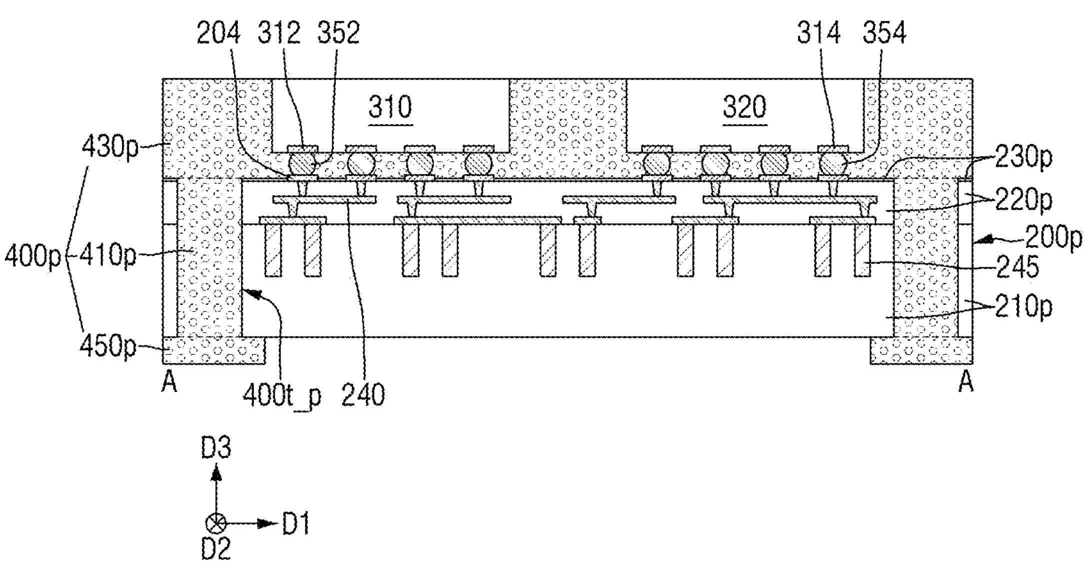

Referring to FIGS. 19 and 20, a pre-mold layer 400*p* may be formed. The pre-mold layer 400*p* may include a pre-penetrating portion 410*p*, a pre-stack portion 430*p*, and a sacrificial portion 450*p*.

The pre-mold layer 400*p* may be discharged onto the upper side of the pre-interposer structure 200*p*. The pre-mold layer 400*p* is discharged onto the upper side of the pre-interposer structure 200*p*, and may be filled between the first semiconductor chip 310 and the pre-interposer structure 200*p*, between the second semiconductor chip 320 and the pre-interposer structure 200*p*, and/or between the pre-trenches 400*t*_p.

The pre-penetrating portions 410*p* may fill the pre-trenches 400*t*_p. The pre-stack portion 430*p* may be placed on the pre-penetrating portion 410*p*. The pre-stack portion 430*p* may be placed on the pre-interposer structure 200*p*. The pre-stack portion 430*p* may cover side walls of the first and second semiconductor chips 310 and 320. The pre-stack portion 430*p* may wrap the second solder balls 352 and the third solder balls 354. Also, the pre-stack portion 430*p* may be filled between the first semiconductor chip 310 and the pre-interposer structure 200*p* and/or between the second semiconductor chip 320 and the pre-interposer structure 200*p*. The sacrificial portion 450*p* may be placed below the pre-interposer structure 200*p*. The sacrificial portion 450*p* may be placed below the pre-penetrating portion 410*p*. The pre-penetrating portion 410*p* may be placed between the sacrificial portion 450*p* and the pre-stack portion 430*p*.

When the pre-mold layer 400*p* is formed, the pre-mold layer 400*p* may flow into the pre-trench 400*t*_p. That is, at least a part of the pre-mold layer 400*p* may fill the pre-trench 400*t*_p. Therefore, no air traps may be formed between the first semiconductor chip 310 and the pre-interposer structure 200*p* and/or between the second semiconductor chip 320 and the pre-interposer structure 200*p*.

The pre-mold layer 400*p* may include, but is not limited to, an insulating polymeric material such as EMC.

Figure 21:
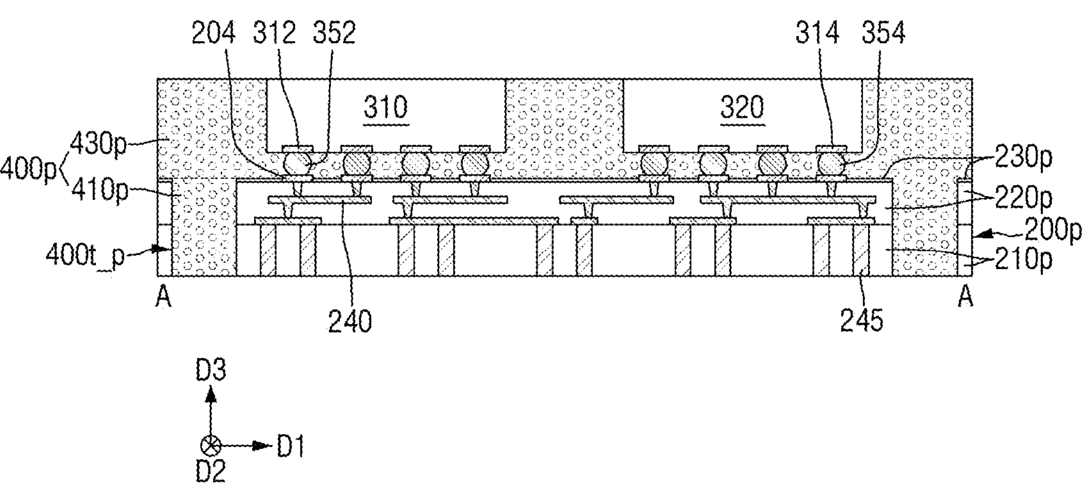

Referring to FIG. 21, the sacrificial portion 450*p* may be removed. Also, a part of the pre-interposer 210*p* may be removed to expose the bottom surface of the through via 245. Specifically, the sacrificial portion 450*p*, the pre-penetrating portion 410*p*, and the pre-interposer 210*p* may be ground to expose the bottom surface of the through via 245. At this time, the bottom surface of the pre-penetrating portion 410*p* and the bottom surface of the through via 245 may be located on the same plane.

Figure 22:
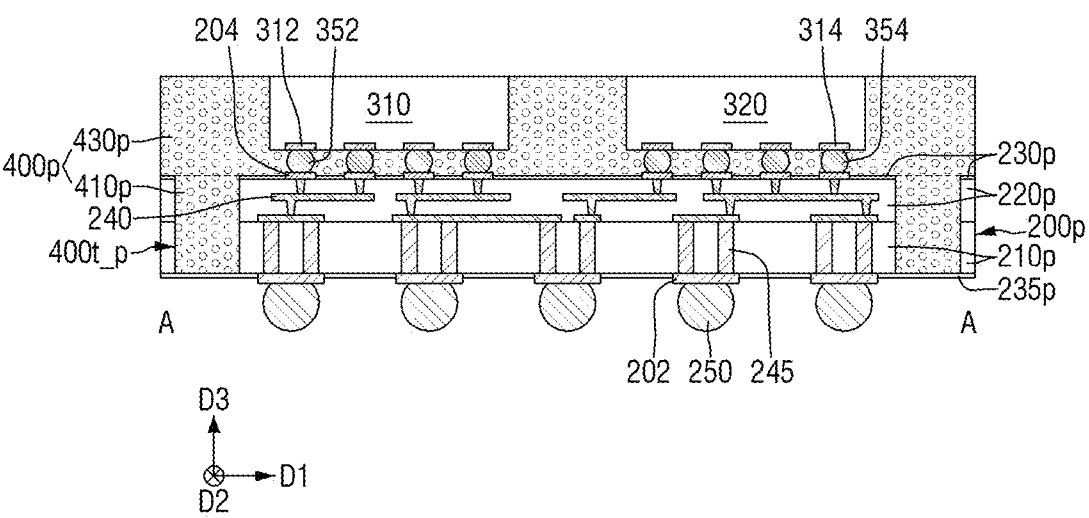

Referring to FIG. 22, a pre-second passivation film 235*p* may be formed on the bottom surface of the pre-penetrating portion 410*p* and the bottom surface of the through via 245. The pre-second passivation film 235*p* may include silicon nitride. In contrast, the pre-second passivation film 235*p* may be made up of a passivation material, BCB (benzocyclobutene), polybenzeneoxazole, polyimide, epoxy, silicon oxide, silicon nitride or a combination thereof.

Subsequently, a plurality of first interposer pads 202 which penetrate the pre-second passivation film 235*p* and are connected to the through vias 245 may be formed. The first solder ball 250 may then be placed on each first interposer pad 202.

Figure 23:
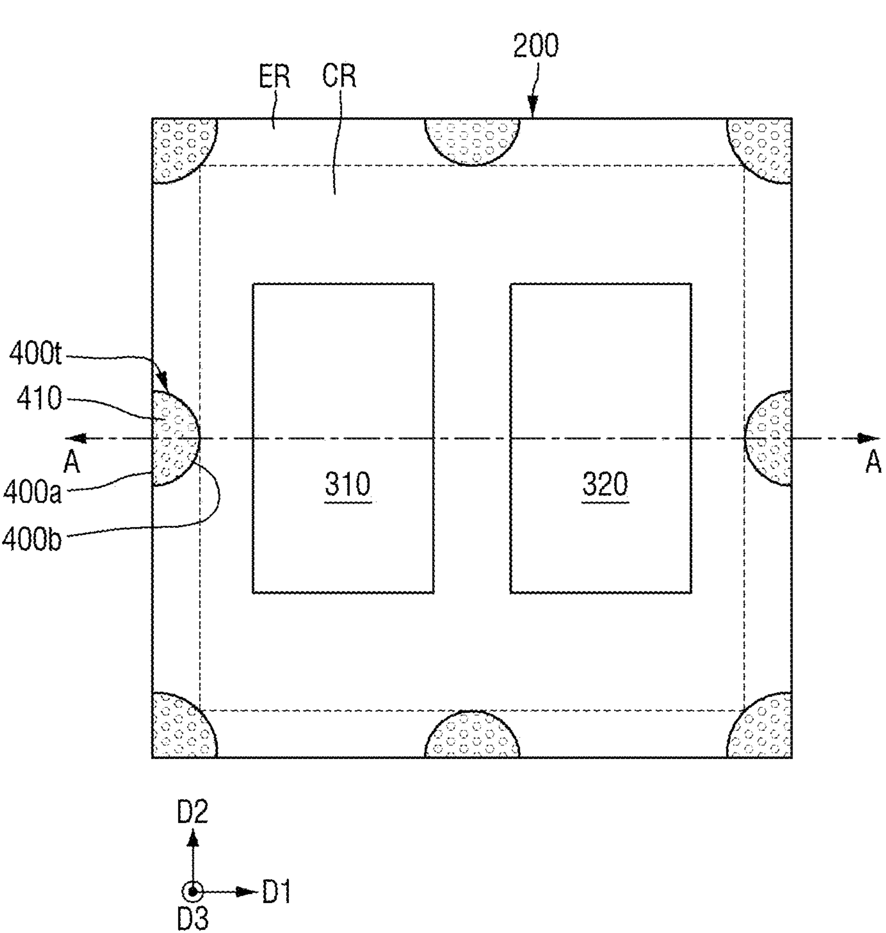
Figure 24:
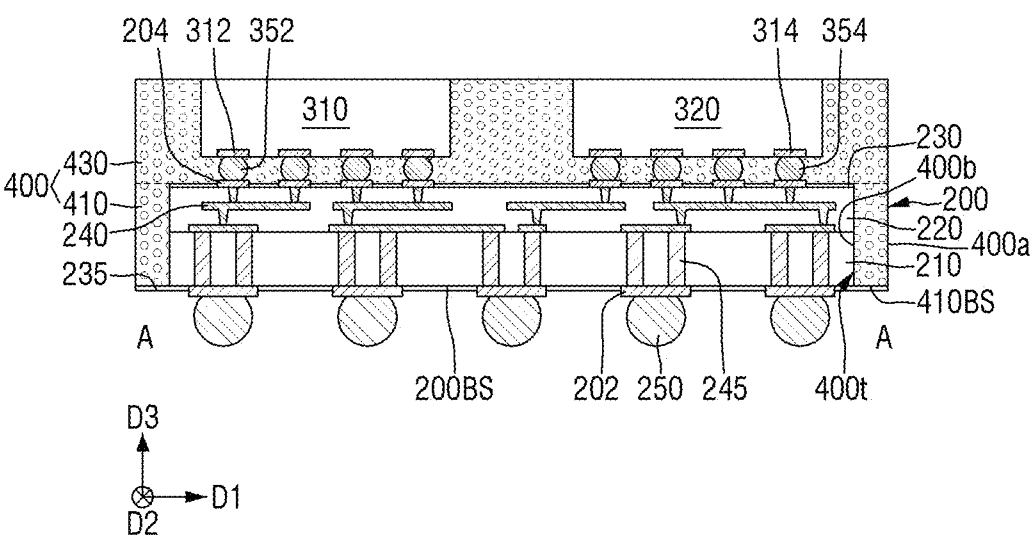

Referring to FIGS. 23 and 24, an interposer structure 200 may be formed. Specifically, the interposer structure 200 may be formed by sawing a part of the scribe lane region SR. The interposer structure 200 includes an edge region ER and a center region CR. The center region CR may be defined by the edge region ER. The edge region ER may surround the center region CR. The width of the edge region ER is smaller than the width of the scribe lane region SR.

The interposer 210, the interlayer insulating layer 220, the first passivation film 230, and the second passivation film 235 may be formed by partially sawing the scribe lane region SR.

Also, the mold layer 400 and the trench 400*t* may be formed by sawing a part of the scribe lane region SR. The trench 400*t* includes a first side 400*a* and a second side 400*b*. The first side 400*a* may be located on the same plane as one side wall of the interposer structure 200. The second side 400*b* may be opposite to the first side 400*a*. The second side 400*b* may be a curved surface. The mold layer 400 may be placed inside the trench 400*t*. Specifically, the penetrating portion 410 of the mold layer 400 may be placed in the trench 400*t*.

The mold layer 400 may include a penetrating portion 410 and a stack portion 430. The stack portion 430 is placed on the penetrating portion 410. The stack portion 430 may cover side walls of the first and second semiconductor chips 310 and 320. The stack portion 430 may be filled between the first semiconductor chip 310 and the interposer structure 200 and/or between the second semiconductor chip 320 and the interposer structure 200.

Figure 25:
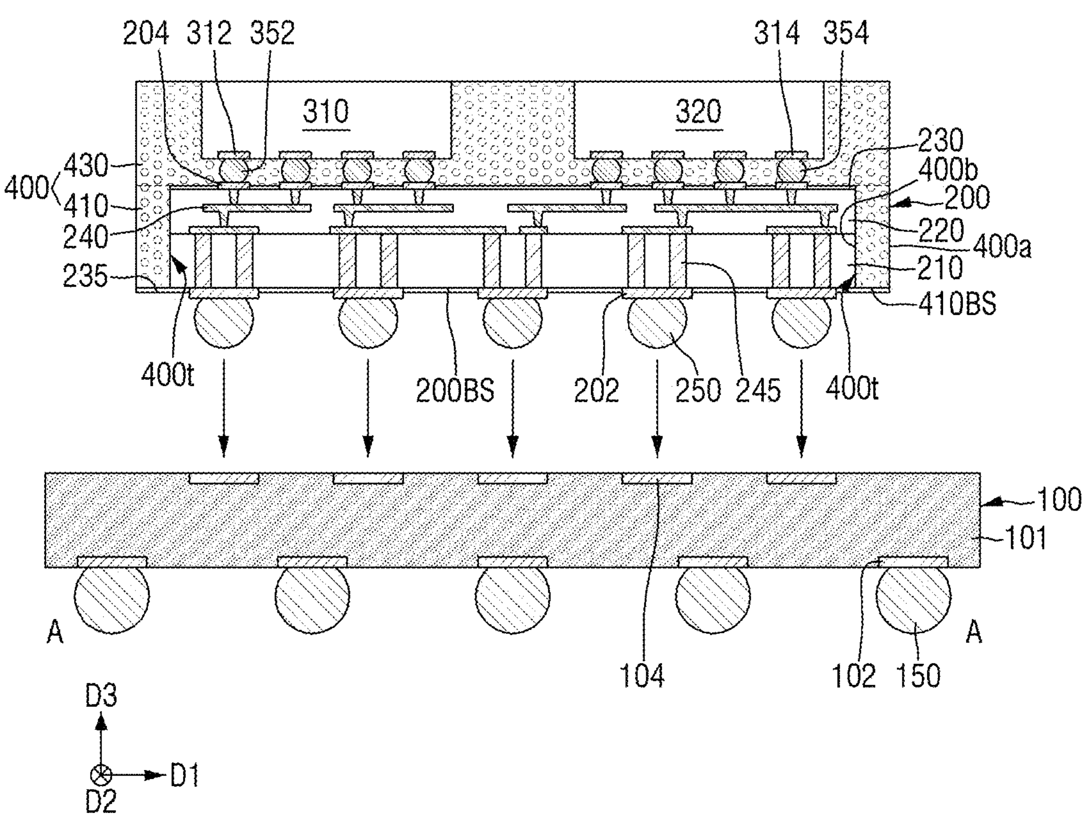

Referring to FIG. 25, a circuit board 100 may be provided. The circuit board 100 may be a packaging board. The circuit board 100 may be a printed circuit board (PCB). The circuit board 100 may include an insulating core 101, a first board pad 102, and a second board pad 104. The first solder balls 250 may correspond to the second board pads 104 of the circuit board 100. A connection terminal 150 may be attached to the first board pad 102.

Figure 26:
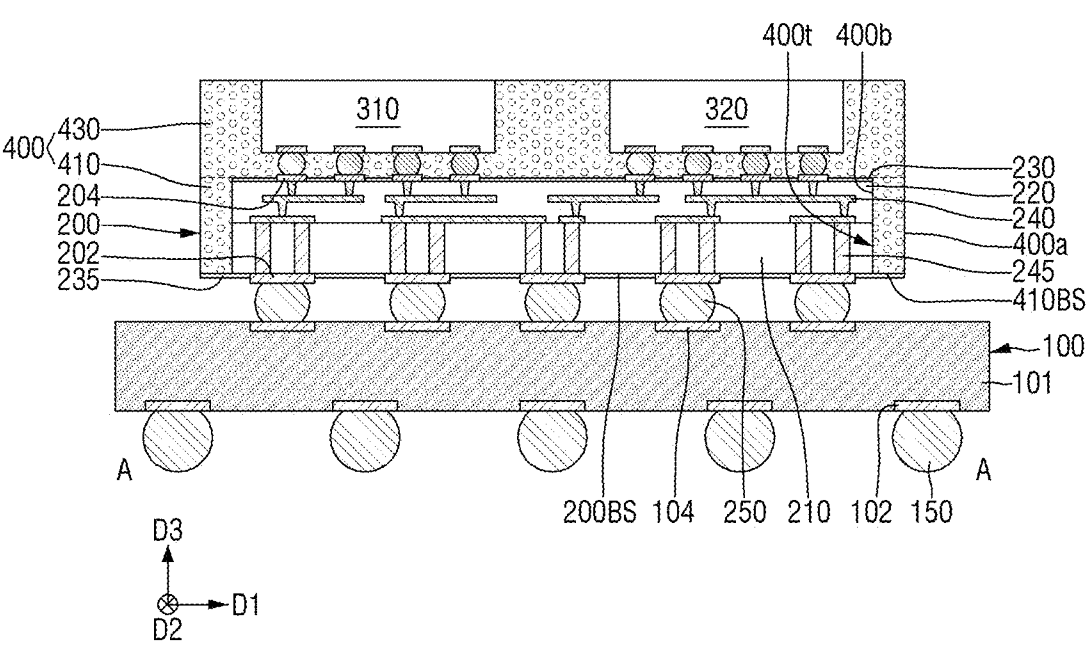

Referring to FIG. 26, the first solder balls 250 may be connected to the second board pads 104 of the circuit board 100. Therefore, the circuit board 100 and the interposer structure 200 may be electrically connected. Similarly, the circuit board 100 may be electrically connected to the first and second semiconductor chips 310 and 320.

Figure 27:
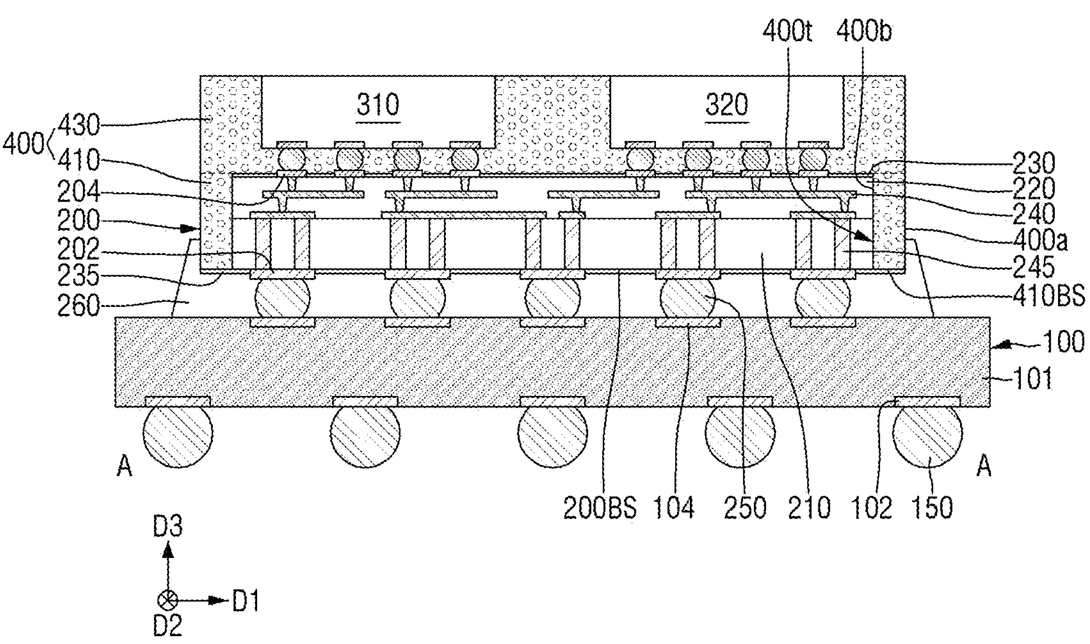

Referring to FIG. 27, an underfill 260 may be formed. The underfill 260 may be discharged to one side of the circuit board 100. The underfill 260 may be filled between the interposer structure 200 and the circuit board 100. The underfill 260 may cover the first solder balls 250. In some embodiments, at least a part of the underfill 260 may cover at least a part of the side walls of the penetrating portion 410 of the mold layer 400. At least a part of the underfill 260 may come into contact with the penetrating portion 410 of the mold layer 400.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A semiconductor package comprising:

a circuit board;

an interposer structure on the circuit board, the interposer structure including an edge region and a center region defined by the edge region, the edge region including a plurality of trenches, the plurality of trenches extending through the interposer structure;

a first semiconductor chip and a second semiconductor chip on the center region of the interposer structure, the first semiconductor chip and the second semiconductor chip being electrically connected to the interposer structure, and the first semiconductor chip and the second semiconductor chip being spaced apart from each other in a first direction;

a mold layer in the plurality of trenches; and a passivation film on a bottom surface of the interposer structure, wherein the mold layer wraps the first semiconductor chip and the second semiconductor chip, the mold layer includes a penetrating portion in the plurality of trenches and a stack portion on the interposer structure, a bottom surface of the penetrating portion of the mold layer is on a same plane as the bottom surface of the interposer structure, and the passivation film covers the bottom surface of the mold layer.

2. The semiconductor package of claim 1, wherein the first direction is parallel to the bottom surface of the interposer structure.

3. The semiconductor package of claim 1, wherein the first direction is perpendicular to the bottom surface of the interposer structure.

4. The semiconductor package of claim 1, further comprising:

a plurality of solder balls connected to the first semiconductor chip and the interposer structure, wherein the plurality of solder balls are between the first semiconductor chip and the interposer structure, and the stack portion of the mold layer wraps around the plurality of solder balls.

5. The semiconductor package of claim 1, wherein the plurality of trenches include a trench, and the trench has a closed curve shape in which a planar first surface and a curved second surface are connected to each other from a planar viewpoint.

6. The semiconductor package of claim 5, wherein the curved second surface faces the first semiconductor chip, and the planar first surface is opposite the first semiconductor chip.

7. The semiconductor package of claim 1, further comprising:

a plurality of connection terminals between the interposer structure and the circuit board; and an underfill between the interposer structure and the circuit board, wherein the underfill covers the plurality of connection terminals, and the underfill covers a part of a side wall of the penetrating portion of the mold layer.

8. The semiconductor package of claim 1, wherein the interposer structure further includes an interposer, an interlayer dielectric layer on the interposer, and a through via penetrating the interposer, and at least a part of the penetrating portion of the mold layer overlaps the through via in a direction parallel to the bottom surface of the interposer structure.

9. A semiconductor package comprising:

a circuit board;

an interposer structure on the circuit board;

a first semiconductor chip on the interposer structure and electrically connected to the interposer structure;

one or more second semiconductor chips on the interposer structure, the one or more second semiconductor chips being electrically connected to the interposer structure, and the one or more second semiconductor chips being spaced apart from the first semiconductor chip in a first direction;

a mold layer including a penetrating portion in the interposer structure and a stack portion on the interposer structure;

a passivation film on a bottom surface of the interposer structure, wherein one side wall of the penetrating portion of the mold layer is in a same plane as a side wall of the interposer structure, a bottom surface of the penetrating portion of the mold layer is coplanar with the bottom surface of the interposer structure, and the passivation film covers the bottom surface of the penetrating portion of the mold layer.

10. The semiconductor package of claim 9, wherein the first direction is parallel to the bottom surface of the interposer structure.

11. The semiconductor package of claim 9, wherein the first direction is perpendicular to the bottom surface of the interposer structure.

12. The semiconductor package of claim 9, wherein the one or more second semiconductor chips is a plurality of second semiconductor chips, the stack portion of the mold layer is between the plurality of second semiconductor chips.

13. The semiconductor package of claim 9, wherein the interposer structure further includes an interposer on the passivation film, and a width of the passivation film is greater than a width of the interposer.

14. The semiconductor package of claim 9, wherein the penetrating portion of the mold layer does not overlap the first semiconductor chip and does not overlap the one or more second semiconductor chips.

15. A semiconductor package comprising:

a circuit board;

an interposer structure on the circuit board, the interposer structure including an edge region and a center region defined by the edge region, the edge region including a plurality of trenches, the plurality of trenches having side walls that each include a planar first surface and a curved second surface;

a logic chip on the center region of the interposer structure and electrically connected to the interposer structure;

one or more memory chips on the interposer structure and spaced apart from the logic chip in a first direction;

a mold layer in the plurality of trenches, the mold layer wrapping the logic chip and the one or more memory chips, the mold layer including a penetrating portion in the plurality of trenches and a stack portion on the interposer structure;

a passivation film on a bottom surface of the interposer structure, the passivation film covering a bottom surface of the penetrating portion of the mold layer;

a plurality of connection terminals between the passivation film and the circuit board; and an underfill between the interposer structure and the circuit board, wherein the underfill covers the plurality of connection terminals, the underfill covers a part of side walls of the penetrating portion of the mold layer, the planar first surface is opposite the logic chip, the curved second surface faces the logic chip, the planar first surface and the side walls of the interposer structure are on a same plane, and the bottom surface of the penetrating portion of the mold layer is coplanar with the bottom surface of the interposer structure.

16. The semiconductor package of claim 15, wherein the first direction is parallel to the bottom surface of the interposer structure.

17. The semiconductor package of claim 15, wherein the first direction is perpendicular to the bottom surface of the interposer structure.

18. The semiconductor package of claim 15, wherein the one or more memory chips is a plurality of memory chips, and the stack portion of the mold layer is filled between the plurality of memory chips.

* * * * *